(12) United States Patent
Uchiyama

(10) Patent No.: US 8,405,089 B2
(45) Date of Patent: Mar. 26, 2013

(54) SEMICONDUCTOR MEMORY DEVICE AND MANUFACTURING METHOD THEREOF

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 318 days.

(21) Appl. No.: 12/659,563

(22) Filed: Mar. 12, 2010

(65) Prior Publication Data

US 2010/0237397 A1    Sep. 23, 2010

(30) Foreign Application Priority Data

Mar. 17, 2009    (JP) ................................ 2009-064798

(51) Int. Cl.
*H01L 21/8239* (2006.01)
*H01L 21/8242* (2006.01)

(52) U.S. Cl. ................ 257/68; 257/71; 257/E27.088; 257/E27.089; 257/E27.091; 257/E21.655; 257/E21.657; 438/242; 438/259; 438/268; 438/270; 438/272

(58) Field of Classification Search .............. 257/68, 257/71, E27.084–E27.086, E27.088–E27.089, 257/E27.091–E27.094, E27.096, E21.645–E21.649, 257/E21.652, E21.655, E21.657–E21.666; 438/137–138, 156, 173, 192, 206, 209, 212, 438/242–248, 259, 268–272
See application file for complete search history.

(56) References Cited

U.S. PATENT DOCUMENTS

| 6,034,389 | A * | 3/2000 | Burns et al. ............. 257/301 |
|---|---|---|---|
| 6,172,391 | B1 * | 1/2001 | Goebel et al. ............. 257/305 |
| 6,335,239 | B1 * | 1/2002 | Agahi et al. ............. 438/245 |
| 6,455,368 | B2 * | 9/2002 | Aoki ............. 438/241 |
| 6,707,706 | B2 * | 3/2004 | Nitayama et al. ............. 365/149 |
| 6,773,985 | B2 * | 8/2004 | Suh ............. 438/243 |
| 7,247,541 | B2 * | 7/2007 | Lee et al. ............. 438/286 |
| 7,372,091 | B2 * | 5/2008 | Leslie ............. 257/296 |
| 7,414,279 | B2 * | 8/2008 | Park ............. 257/296 |
| 7,851,303 | B2 * | 12/2010 | Mikasa ............. 438/253 |
| 7,977,725 | B2 * | 7/2011 | Yoon et al. ............. 257/306 |
| 8,013,373 | B2 * | 9/2011 | Uchiyama ............. 257/296 |
| 8,154,065 | B2 * | 4/2012 | Yoon et al. ............. 257/308 |
| 8,164,129 | B2 * | 4/2012 | Uchiyama ............. 257/296 |
| 8,222,105 | B2 * | 7/2012 | Haller et al. ............. 438/253 |
| 2001/0052614 | A1 * | 12/2001 | Ishibashi ............. 257/306 |
| 2002/0094628 | A1 * | 7/2002 | Goebel et al. ............. 438/212 |
| 2003/0001290 | A1 * | 1/2003 | Nitayama et al. ............. 257/907 |
| 2003/0132476 | A1 * | 7/2003 | Ichise et al. ............. 257/309 |

(Continued)

FOREIGN PATENT DOCUMENTS

JP    2009-10366 A    1/2009

*Primary Examiner* — Matthew Landau
*Assistant Examiner* — Maliheh Malek
(74) *Attorney, Agent, or Firm* — McGinn IP Law Group, PLLC

(57) ABSTRACT

To provide an active region having first and second diffusion layers positioned at both sides of a gate trench and a third diffusion layer formed on a bottom surface of the gate trench, first and second memory elements connected to the first and second diffusion layers, respectively, a bit line connected to the third diffusion layer, a first gate electrode that covers a first side surface of the gate trench via a gate dielectric film and forms a channel between the first diffusion layer and the third diffusion layer, and a second gate electrode that covers a second side surface of the gate trench via a gate dielectric film and forms a channel between the second diffusion layer and the third diffusion layer. According to the present invention, because separate transistors are formed on both side surfaces of a gate trench, two times of conventional integration can be achieved.

16 Claims, 26 Drawing Sheets

U.S. PATENT DOCUMENTS

| | | | |
|---|---|---|---|
| 2003/0164527 A1* | 9/2003 | Sugi et al. | 257/401 |
| 2004/0147073 A1* | 7/2004 | Lee | 438/238 |
| 2005/0087800 A1* | 4/2005 | Sugi et al. | 257/328 |
| 2006/0284225 A1* | 12/2006 | Popp et al. | 257/296 |
| 2008/0014695 A1* | 1/2008 | Lee et al. | 438/239 |
| 2008/0258209 A1* | 10/2008 | Oyu | 257/329 |
| 2008/0296671 A1 | 12/2008 | Takaishi | |
| 2008/0303087 A1* | 12/2008 | Sugi et al. | 257/334 |
| 2009/0026517 A1* | 1/2009 | Uchiyama | 257/306 |
| 2009/0087958 A1* | 4/2009 | Uchiyama | 438/387 |
| 2009/0194814 A1* | 8/2009 | Sugioka | 257/331 |
| 2009/0200593 A1* | 8/2009 | Uchiyama | 257/296 |
| 2009/0218609 A1* | 9/2009 | Goo et al. | 257/296 |
| 2010/0237407 A1* | 9/2010 | Nojima | 257/329 |
| 2012/0025324 A1* | 2/2012 | Takaishi | 257/390 |

\* cited by examiner

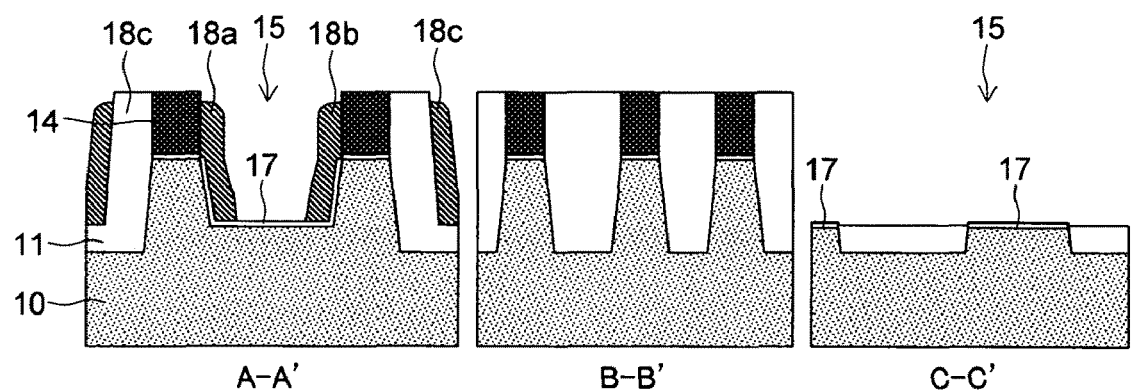

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly relates to a semiconductor memory device including a three-dimensional transistor and a manufacturing method of the semiconductor memory device.

2. Description of Related Art

The integration enhancement of semiconductor memory devices such as DRAM (Dynamic Random Access Memory) has been mainly achieved by downscaling the transistor size. However, the downscaling of transistors has almost reached its limit. If the transistor size is downscaled even more, it has a risk that the transistors do not operate correctly due to a short channel effect or the like.

In a conventional DRAM, a cell contact electrode to connect a cell capacitor and a cell transistor is provided to pierce through a bit line layer in which bit lines are formed. Therefore, the cell contact electrode needs to be securely dielectrically isolated from the bit lines. For this purpose, a SAC (Self Aligned Contact) etching technique using a silicon nitride film and a technique that forms a contact hole having smaller diameter than a resolution limit by using a side wall film (hole-pattern reduction technique) are used. However, the use of the SAC etching technique and the hole-pattern reduction technique has a problem of reducing a contact area of a bottom of the cell contact electrode.

As a measure of fundamentally solving such a problem, methods of three-dimensionally forming transistors by three-dimensionally processing a semiconductor substrate have been proposed. Particularly, a three-dimensional transistor that uses a silicon pillar extending in a vertical direction with respect to a main plane of the semiconductor substrate as a channel has an advantage of a small occupation area and can obtain a large drain current based on a complete depletion. The densest layout of $4F^2$ can be also achieved in this transistor (see Japanese Patent Application Laid-open No. 2009-010366).

When a vertical transistor using a silicon pillar is used as a cell transistor of a semiconductor memory device, one of diffusion layers that becomes a source or a drain is connected to a bit line, and the other diffusion layer is connected to a memory element (a cell capacitor in a DRAM). Normally, a memory element such as a cell capacitor is arranged above a cell transistor. Therefore, the memory element is connected to an upper part of the silicon pillar, and the bit line is connected to a lower part of the silicon pillar.

However, because a lower part of the silicon pillar is a semiconductor substrate, it is not necessarily easy to form a bit line at the lower part of the silicon pillar, and this requires a complex process in many cases. In this case, the bit line needs to be embedded into the semiconductor substrate. This results in a complex configuration and increases the parasitic capacitance of the bit line. Further, along with the downscaling of the transistor size, it has been difficult to secure a space to embed the bit line.

On the other hand, in conventional DRAMs as well as in DRAMs using a three-dimensional transistor, lithographic processing using an exclusive mask pattern is necessary to form a cell capacitor and a cell contact electrode. Therefore, the number of masks and the number of processes cannot be reduced and this results in cost increase.

Further, in conventional DRAMs as well as in DRAMs using a three-dimensional transistor, a memory cell is formed by processing each constituent element basically at a 2F pitch relative to the minimum feature size F. Therefore, only a memory cell having a cell area of $4F^2$ at minimum can be achieved, and this becomes a constraint to achieve further downscaling.

SUMMARY

In one embodiment, there is provided a semiconductor memory device comprising: an active region formed with a gate trench having mutually opposite first and second side surfaces and a bottom surface, the active region having first and second diffusion layers positioned at both sides of the gate trench and a third diffusion layer formed on the bottom surface of the gate trench; first and second memory elements electrically connected to the first and second diffusion layers, respectively; a bit line electrically connected to the third diffusion layer; a first gate electrode that covers the first side surface of the gate trench via a first gate dielectric film, the first gate electrode producing a channel between the first diffusion layer and the third diffusion layer; and a second gate electrode that covers the second side surface of the gate trench via a second gate dielectric film, the second gate electrode producing a channel between the second diffusion layer and the third diffusion layer.

In another embodiment, there is provided a semiconductor memory device comprising: a semiconductor substrate provided with a plurality of gate trenches each extended in a first direction and having mutually opposite first and second side surfaces and a bottom surface; a plurality of bit lines each extended in a second direction substantially orthogonal to the first direction; a plurality of first word lines each provided along the first side surface of corresponding one of the gate trenches; a plurality of second word lines each provided along the second side surface of corresponding one of the gate trenches; a plurality of active regions each provided on the semiconductor substrate at each intersection of the gate trench and the bit line, each of the active regions having a center section crossed by corresponding one of the gate trenches; a plurality of first and second diffusion layers provided in the active regions, each pair of the first and second diffusion layers being positioned at both sides of corresponding one of the gate trenches; a plurality of third diffusion layers each provided in corresponding one of the active regions, each of the third diffusion layers being provided on the bottom surface of corresponding one of the gate trench, and electrically connected to corresponding one of the bit lines; a plurality of first memory elements each electrically connected to corresponding one of the first diffusion layers; and a plurality of second memory elements each electrically connected to corresponding one of the second diffusion layers, wherein each of the first memory elements is electrically connected to corresponding one of the bit lines by activating corresponding one of the first word lines, and each of the second memory elements is electrically connected to corresponding one of the bit lines by activating corresponding one of the second word lines.

In still another embodiment, there is provided a manufacturing method of a semiconductor memory device comprising: forming an active region on a semiconductor substrate surrounded by an isolation region; forming a gate trench in the semiconductor substrate crossing the active region; forming first and second gate electrodes on both side surfaces of the gate trench via gate dielectric films, respectively; forming first and second diffusion layers within the active region positioned at both sides of the gate trench; forming a third diffusion layer on a bottom surface of the gate trench; forming a bit line electrically connected to the third diffusion layer; and forming first and second memory elements electrically connected to the first and second diffusion layers, respectively.

According to the present invention, a one-bit memory cell can be formed in a half of a conventional area, because separate transistors are formed on both side surfaces of a gate trench. That is, two times of the conventional integration can be achieved. Further, the conventional problem of a three-dimensional transistor using an embedded bit line can be solved, because it is not necessary to embed a bit line into the semiconductor substrate. Furthermore, when a gate trench and a bit line are formed in the minimum feature size F, a cell area of $2F^2$ can be achieved, and the integration can be improved considerably.

When a cell area is considered as constant, a stable-productivity process of one or two generations before can be used. Therefore, a vertical startup of production and the productivity improvement can be easily achieved. For example, a memory cell having the same cell area as that of a $6F^2$ cell in a 45 nm process can be provided in a 63 nm process, and a memory cell having the same cell area as that of a $6F^2$ cell in a 5.4 nm process can be provided in a 93 nm process. As a result, the production stability and improved productivity can be achieved at the start of development.

Furthermore, according to the present invention, first and second memory elements can be formed on both side surfaces, respectively of a bit line. In this case, an exclusive mask pattern to form a cell capacitor and a cell contact electrode is unnecessary. Consequently, the number of masks and the number of processes can be reduced as compared to those conventionally required. As a result, cost reduction can be also achieved.

BRIEF DESCRIPTION OF THE DRAWINGS

The above features and advantages of the present invention will be more apparent from the following description of certain preferred embodiments taken in conjunction with the accompanying drawings, in which:

FIG. 8A to FIG. 8C are schematic cross-sectional views showing a manufacturing process (forming gate electrodes 18a and 18b) of the DRAM memory cell 100;

DETAILED DESCRIPTION OF THE PREFERRED EMBODIMENTS

Preferred embodiments of the present invention will now be explained in detail with reference to the drawings.

Figure 1:
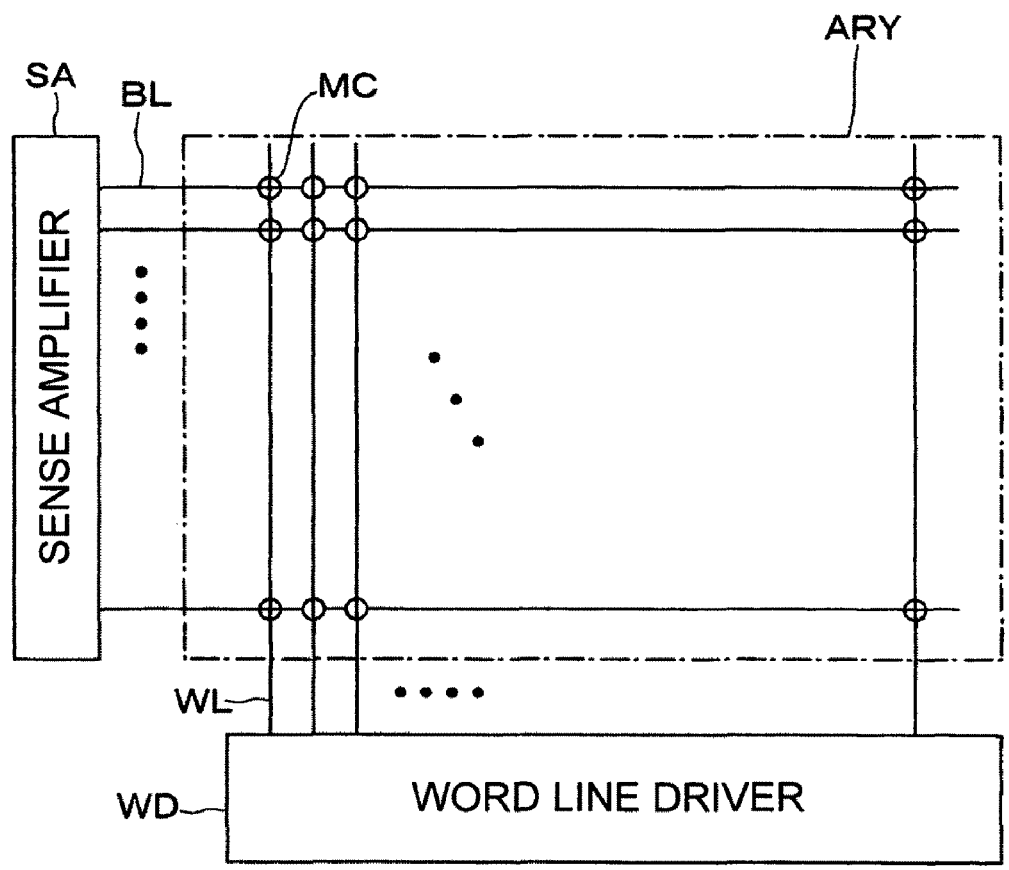
FIG. 1 is a schematic diagram showing a cell array configuration of a semiconductor memory device according to a first embodiment of the present invention.

FIG. 1 is a schematic diagram showing a cell array configuration of a semiconductor memory device according to a first embodiment of the present invention.

As shown in FIG. 1, a cell array ARY of the semiconductor memory device according to the first embodiment includes plural word lines WL driven by a word line driver WD, plural bit lines BL connected to a sense amplifier SA, and memory cells MC arranged at intersections between the word lines WL and the bit lines BL.

Figure 2:
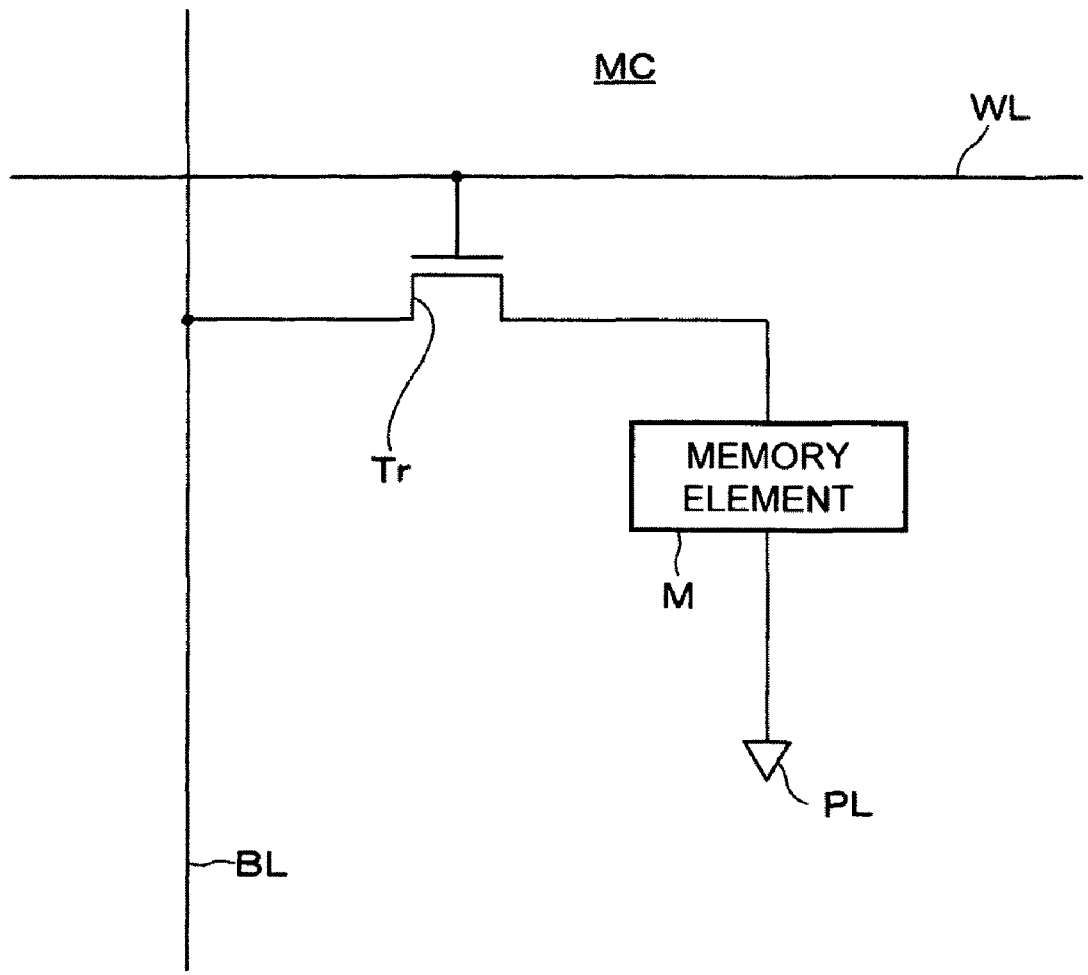
FIG. 2 is a circuit diagram of a memory cell MC.

FIG. 2 is a circuit diagram of a memory cell MC.

As shown in FIG. 2, the memory cell MC has a configuration having a cell transistor Tr and a memory element M connected in series in this order between the bit line BL and a reference potential wiring PL. A gate electrode of the cell transistor Tr is connected to corresponding word line WL. While the type of the memory element M is not particularly limited, a capacitor is used as the memory element M for a DRAM.

A device configuration of the semiconductor memory device according to the first embodiment is explained in detail by exemplifying a DRAM, in which the memory element M is a capacitor.

Figure 3:
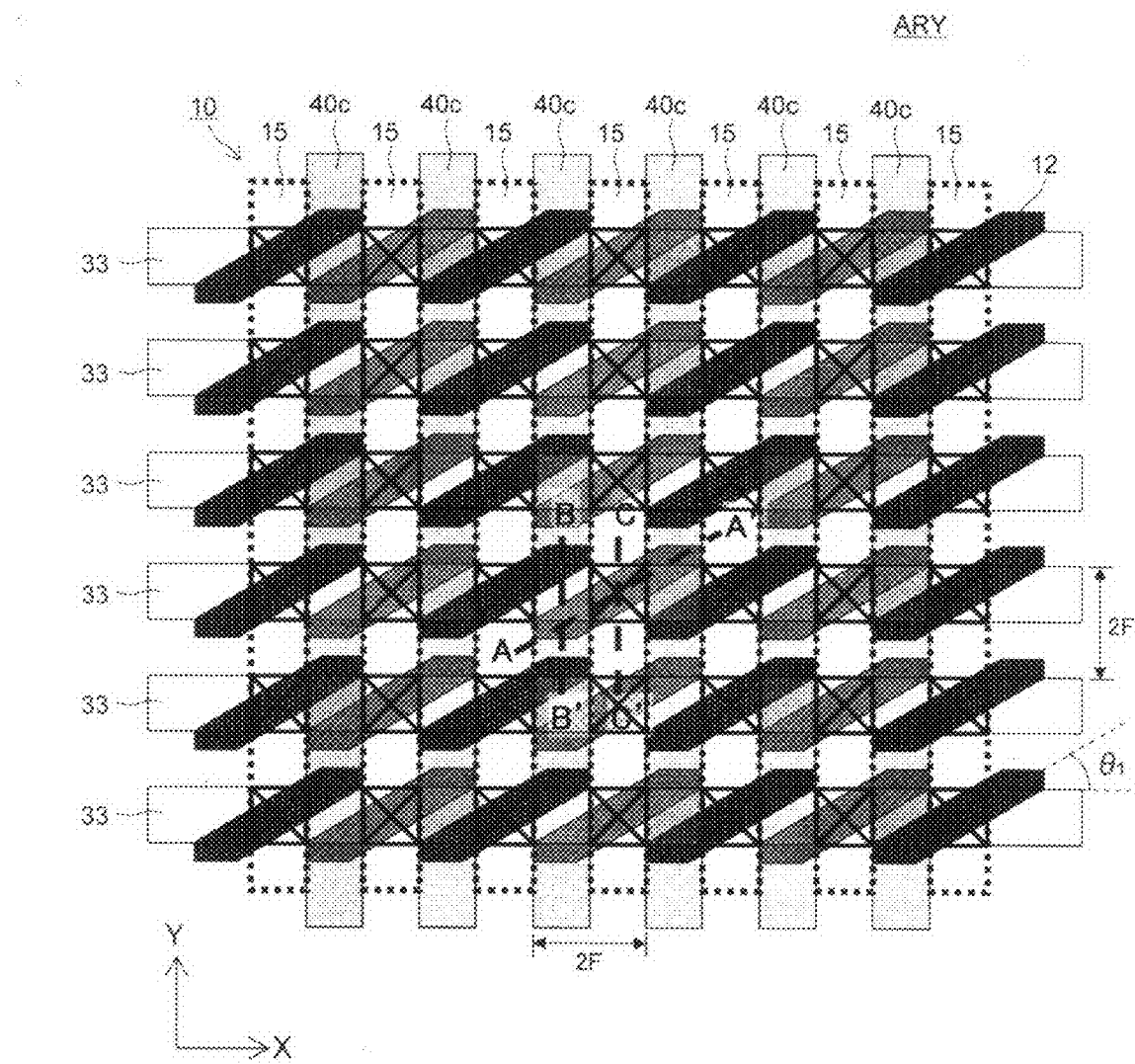
FIG. 3 is a plan layout of a DRAM memory array ARY.

FIG. 3 is a plan layout of a DRAM memory array ARY.

As shown in FIG. 3, the DRAM memory array ARY includes plural active regions (active fields) 12, plural bit lines 33 extended in an X direction, and gate trenches 15 and storage areas 40c extended in a Y direction, provided on a semiconductor substrate. The active regions 12 have slender island patterns, and are arranged in a matrix shape in the X direction and the Y direction. That is, the active regions 12 are arranged along the bit lines 33 in the X direction, and are arranged along the gate trenches 15 in the Y direction.

A center of each active region 12 is positioned at an intersection between the gate trench 15 and the bit line 33, and the active region 12 in a longitudinal direction is arranged in oblique not in parallel with the X direction or the Y direction. Particularly, in the first embodiment, an intersection angle θ1 between the active region 12 and the bit line 33 is preferably equal to or larger than 15 degrees and equal to or smaller than 25 degrees, and is most preferably about 18 degrees. When the intersection angle θ1 is this angle, storage electrodes of cell capacitors described later can have a larger width in the X direction, and the storage electrodes can be securely connected to a cell transistor.

The bit lines 33 have stripe patterns repeated at a 2F pitch in the Y direction. The bit lines 33 are provided in a bit line layer positioned above a substrate surface of the semiconductor substrate, and pass through centers of the active regions 12 in a longitudinal direction in a plan view. Storage electrodes of cell capacitors are provided at ends of the active regions 12 not superimposed with the bit line 33, and the storage electrodes are formed on side surfaces of a laminated film including the bit line 33, as described later in detail.

The gate trenches 15 have stripe patterns repeated at a 2F pitch in the X direction. Therefore, the gate trenches 15 are provided orthogonally with the bit lines 33. The gate trenches 15 are provided on the substrate surface of the semiconductor substrate, and pass through the centers of the active regions 12. The gate trenches 15 provide stages to form gate electrodes (word lines) of a MOS transistor. Word lines are provided to extend in the Y direction on both side surfaces of stages of the gate trenches 15.

The storage areas 40c are regions where plural cell capacitors are arranged, and the storage areas 40c are positioned between adjacent gate trenches 15. Therefore, the storage areas 40c are patterns appearing repetitively at a 2F pitch in the X direction. Cell capacitors are arranged at each F pitch within one storage area 40c extended in the Y direction. Two cell capacitors adjacent in the Y direction within the same storage area 40c correspond to mutually different active regions 12.

Figure 4:
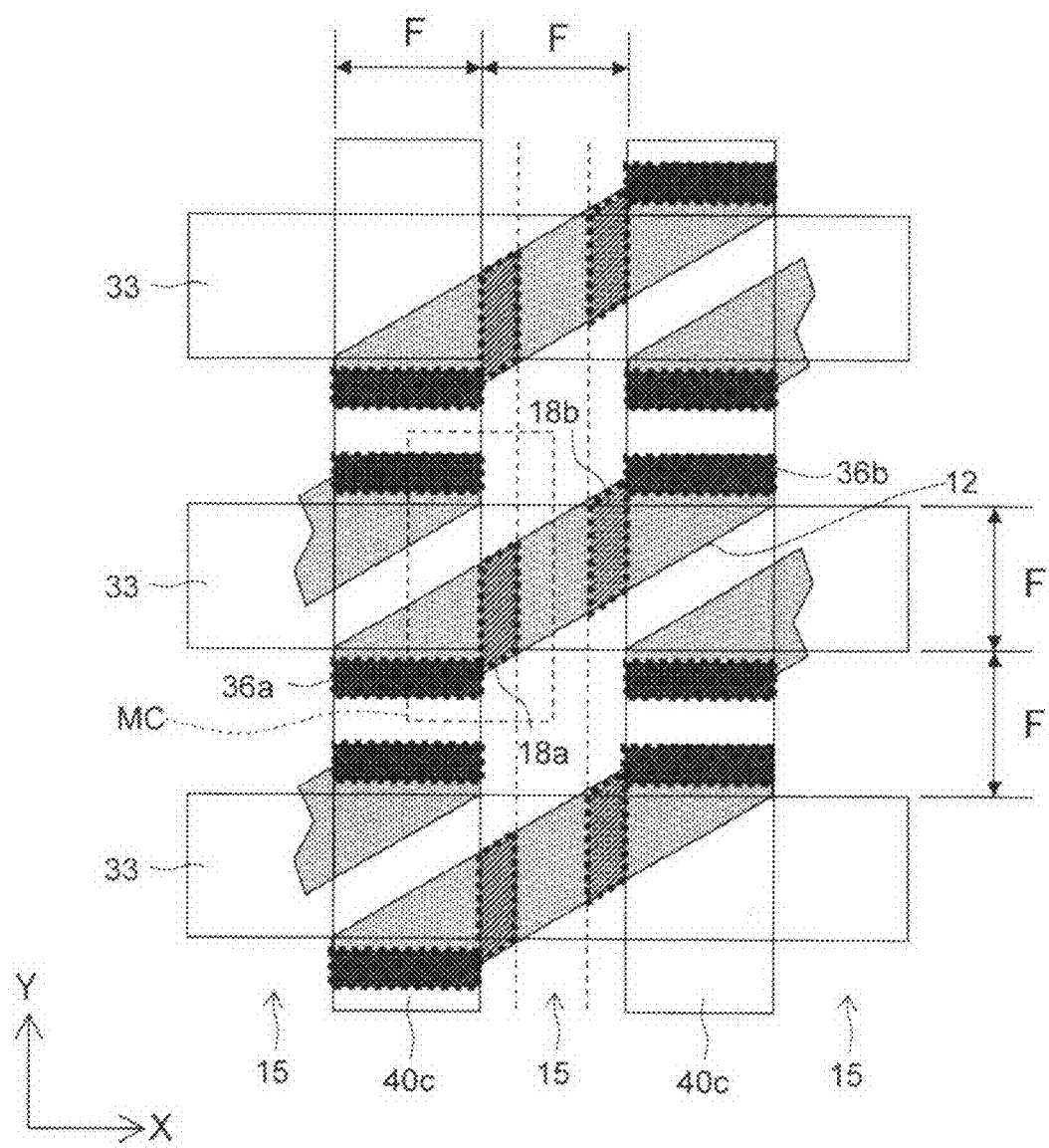
FIG. 4 is a schematic plan view showing one active region 12 and its periphery in an enlarged manner.

FIG. 4 is a schematic plan view showing one active region 12 and its periphery in an enlarged manner.

As shown in FIG. 4, the gate trenches 15 are arranged at a 2F pitch, and cross the centers of the active regions 12. Because the gate trenches 15 are extended in the Y direction, the gate trenches 15 are formed in shallow trench isolation regions (STI) as well as in the active regions 12. Gate electrodes (word lines) 18 of a cell transistor are arranged on both side surfaces of stages of the gate trenches 15. Because the gate electrodes 18 are formed on mutually opposite left and right side surfaces, respectively within the gate trenches in this way, two gate electrodes 18a and 18b are present within one gate trench 15. Because each gate electrode is formed along a side surface of the gate trench 15 extended in the Y direction, the gate electrode is formed in the shallow trench isolation region as well as in the active region 12, and is extended in the Y direction, together with the gate trench 15. That is, two gate electrodes are provided in one gate trench 15, and have linear patterns extended in the Y direction.

The bit lines 33 are arranged at a 2F pitch, and pass through the centers of the active regions 12 in a plan view. The bit lines 33 are extended in the X direction, and cover above the active regions 12. Regions (exposed regions) not superimposed with the bit lines 33 in a plan view are present at ends of the active regions 12. These exposed regions are not superimposed with either the bit lines 33 or the gate trenches 15. Storage electrodes 36 of cell capacitors are arranged in the exposed regions formed at the ends of the active regions 12. The storage electrodes 36 are connected to diffusion layers within the active regions 12 either directly or via capacitance contact plugs in self alignment. The storage electrodes 36 are formed in a sidewall mode on sidewalls of stages formed by the bit lines 33, as described later in detail.

Based on the configurations described above, the gate electrode 18a and a storage electrode 36a provided in a left half region of each active region 12 become constituent elements of one DRAM memory cell, and the gate electrode 18b and a storage electrode 36b provided in a right half region of the active region 12 become constituent elements of another DRAM memory cell. That is, a two-bit memory cell is configured in one active region 12. An occupied area of one-bit memory cell is a rectangular region shown by a broken line MC in FIG. 4, and is $F \times 2F = 2F^2$. An actual one-bit cell region includes up to a front end of the active region 12 concerned, and does not include a front end of an adjacent (left side) active region 12. To facilitate understanding of a cell area, the occupied area of one-bit memory cell is defined as a rectangular region. The active regions 12 are arranged at an F pitch, because a one-bit gate electrode needs to be formed in a half region at an intersection of a lattice of the bit line 33 and the gate trench 15 formed in the minimum feature size F.

A memory element including a storage electrode 36a (36b) connected to a predetermined active region and a memory element including a storage electrode 36b (36a) connected to a separate active region adjacent to the predetermined active region in the X direction are arranged in the Y direction. That is, X coordinates of these memory elements coincide with each other, and therefore these memory elements are arranged in the same storage area 40c. On the other hand, a memory element including a storage electrode 36a (36b) connected to a predetermined active region and a memory element including a storage electrode 36a (36b) connected to a separate active region adjacent to the predetermined active region in the X direction are arranged in the X direction. That is, Y coordinates of these memory elements coincide with each other, and therefore these memory elements are arranged in adjacent storage areas 40c, respectively.

Figures 5A, 5B, 5C:
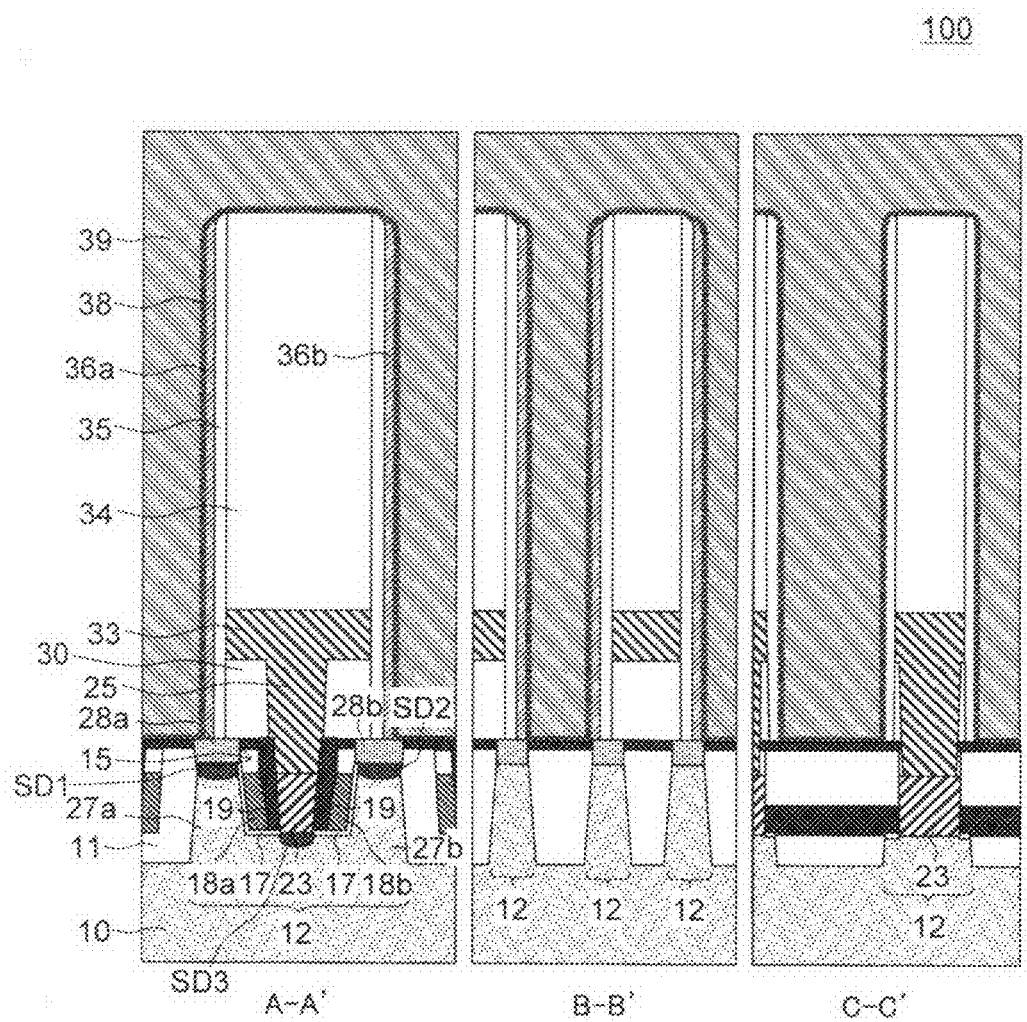
FIG. 5A to FIG. 5C are cross sectional views of a DRAM memory cell 100 along a line A-A', a line B-B', and a line C-C' in FIG. 3, respectively.

FIG. 5A to FIG. 5C are cross sectional views of a DRAM memory cell along a line A-A', a line B-B', and a line C-C' in FIG. 3, respectively.

As shown in FIG. 5A to FIG. 5C, a DRAM memory cell 100 according to the first embodiment includes an STI 11 formed on the semiconductor substrate 10, the active regions 12 having an island shape dielectrically isolated from each other by the STI 11, the gate trenches 15 formed at the centers of the active regions 12 in a longitudinal direction, a gate dielectric film 17 formed on sidewall surfaces within the gate trenches 15, the gate electrodes (word lines) 18a and 18b formed via the gate dielectric film 17 on side surfaces of stages of the gate trenches 15, a bit-line contact plug 23 provided within each gate trench 15, a gate-cap dielectric film 19 dielectrically isolating the gate electrodes 18a and 18b from the bit-line contact plug 23 within the gate trench 15, the bit lines 33 provided on an upper layer of the semiconductor substrate 10 via an interlayer dielectric film 30, and a bit-line cap dielectric film 34 that covers an upper surface of each bit line 33.

The DRAM memory cell 100 also includes a sidewall dielectric film 35 that covers side surfaces of the bit line 33 and the bit-line cap dielectric film 34, storage electrodes 36a and 36b that cover the sidewall dielectric film 35, and a capacitance dielectric film 38 that covers the storage electrodes 36a and 36b. The storage electrodes 36a and 36b are connected to silicon epitaxial layers 28a and 28b provided in exposed regions at the ends of the active regions 12 not covered by the bit lines 33 and the sidewall dielectric film 35. A surface of the capacitance dielectric film 38 is covered by a common plate, electrode 39. Accordingly, a cell capacitor is configured by the storage electrodes 36, the capacitance dielectric film 38, and the common plate electrode 39. Source/drain diffusion layers SD1 and SD2 are formed in the active regions 12 at portions contacting the silicon epitaxial layers 28a and 28b, respectively.

As described above, the gate electrodes 18a and 18b are formed as sidewalls on the side surfaces of stages of the gate trenches 15. The gate electrodes 18a and 18b are formed by conductive films such as polycrystalline silicon films. To decrease resistances of the gate electrodes 18a and 18b, preferably, these gate electrodes are formed by multilayer films containing high melting-point metals such as tungsten or their compounds. Most preferably, the gate electrodes 18a and 18b are formed by a multilayer film formed by sequentially laminating a polycrystalline silicon film, a tungsten silicide film, a tungsten nitride film, and a tungsten film. The gate electrodes 18a and 18b formed on the left and right side surfaces of the stages of the gate trenches 15 constitute separate cell transistors.

The bit-line contact plug 23 common to the two gate electrodes 18a and 18b is connected to a bottom surface of the gate trench 15. The bit line 33 is connected above the bit-line contact plug 23 via the contact plug 25. As shown in FIG. 4, the bit line 33 is extended in a direction orthogonal to the gate electrodes 18a and 18b. A source/drain diffusion layer SD3 is formed in the active region 12 which is in contact with the bit-line contact plug 23.

The bit-line cap dielectric film 34 having the same flat shape as that of an upper surface of the bit line 33 is provided on the upper surface of the bit line 33. The bit-line cap dielectric film 34 is provided to protect the upper surface of the bit line 33 and to secure as wide as possible a formation surface of the storage electrodes 36a and 36b of a cell capacitor. The sidewall dielectric film 35 is formed on both side surfaces of a laminated film made of the interlayer dielectric film 30, the bit line 33, and the bit-line cap dielectric film 34. The storage electrodes 36a and 36b are formed in a sidewall mode on side surfaces of the laminated film made of the interlayer dielectric film 30, the bit line 33, and the bit-line cap dielectric film 34 via the sidewall dielectric film 35. Particularly, the storage electrodes 36a and 36b are formed in only the exposed regions at the ends of the active regions 12 in a plan view (see FIG. 4). Therefore, FIG. 5C does not show the storage electrodes 36a and 36b in the cross-sectional view along the line C-C' in FIG. 3. Although the capacitance dielectric film 38 is formed on the surface of the storage electrodes 36a and 36b, the capacitance dielectric film 38 covers the entire surface of the substrate as well as the ends of the active regions 12. Therefore, FIG. 5C shows the cross-sectional view of the capacitance dielectric film 38 along the line C-C' in FIG. 3, unlike the storage electrodes 36a and 36b. Further, the common plate electrode 39 is formed on the surface of the capacitance dielectric film 38.

Two divided regions 27a and 27b within the active region 12 divided by the gate trench 15 have a pillar shape. When a predetermined voltage is applied to the gate electrode 18a, a channel of a first cell transistor is formed within the divided region 27a as one divided region, and when a predetermined voltage is applied to the gate electrode 18b, a channel of a second cell transistor is formed within the divided region 27b as the other divided region. Accordingly, when a predetermined voltage is applied to the gate electrode 18a, the source/drain diffusion layer SD1 and the source/drain diffusion layer SD3 become conductive via a channel (not shown). Similarly, when a predetermined voltage is applied to the gate electrode 18b, the source/drain diffusion layer SD2 and the source/drain diffusion layer SD3 become conductive via a channel (not shown).

The silicon epitaxial layers 28a and 28b are provided in the exposed regions at the ends of the active regions 12. Lower ends of the storage electrodes 36a and 36b are connected to the active regions 12 via the silicon epitaxial layers 28a and 28b. The silicon epitaxial layers 28a and 28b function as capacitance contact plugs, and cause stages (projections) of the active regions 12 of the gate trenches 15 to function as diffusion layers of transistors. For this purpose, the silicon epitaxial layers 28a and 28b play a role of supplying a conductive impurity into the active regions 12.

Based on the above configuration, a region in a perpendicular direction within the semiconductor substrate 10 from a bottom of the gate trench 15 to which the bit-line contact plug 23 is connected to the silicon epitaxial layer 28a becomes a channel region of one cell transistor (a first cell transistor), and the channel region is controlled by the word line 18a. A region in a perpendicular direction within the semiconductor substrate 10 from the bottom of the gate trench 15 to which the bit-line contact plug 23 is connected to the silicon epitaxial layer 28b becomes a channel region of the other cell transistor (a second cell transistor), and the channel region is controlled by the word line 18b. As explained above, two vertical MOS transistors are configured within the active region 12 of the semiconductor substrate 10, and an on current flows to a perpendicular direction to a main plane of the semiconductor substrate 10.

That is, a first cell transistor is formed in the region 27a at a left half of the active region 12 divided into two by the gate trench 15, and a second cell transistor is formed in the region 27b at a right half of the active region 12. A first cell capacitor connected to the first cell transistor is provided above the end at the left side of the active region 12, and a second cell capacitor connected to the second cell transistor is provided above the end at the right side of the active region 12.

As explained above, the semiconductor memory device 100 according to the first embodiment has the first and second cell transistors formed on two side surfaces opposite to each other in the X direction within the gate trench 15. Cell capacitors are formed on side surfaces of a laminated film including the bit line 33. Therefore, one memory cell can be formed in a half of a conventional area. Consequently, when the gate trenches 15 and the bit lines 33 are formed in the minimum feature size F, a one-bit memory cell having a cell area of $2F^2$ can be achieved, thereby substantially improving integration.

When a cell area is considered as constant, a process of one generation or two generations before with stable productivity can be used, thereby facilitating a vertical startup of the production and improved productivity. For example, a memory cell having the same cell area as that of a $6F^2$ cell in a 45 nm process can be provided in a 63 nm process, and a memory cell having the same cell area as that of a $6F^2$ cell in a 54 nm process can be provided in a 93 nm process. Consequently, the production stability and improved productivity can be achieved starting from a development time.

Further, according to the present invention, bit lines do not need to be embedded into the semiconductor substrate 10 unlike general $4F^2$ cells. An F value can be increased by about 1.4 times when the F values are compared in the same cell areas. Consequently, the processing precision can be improved, and the parasitic capacitance of bit lines can be substantially reduced. Accordingly, the productivity can be improved, and thus characteristics of memory cells can be improved.

According to the present invention, because the storage electrodes 36a and 36b are formed on side surfaces of stages of bit line patterns, patterns exclusive for storage electrodes like conventional cylinder holes do not need to be provided. Therefore, the number of masks and the number of processes can be reduced, thereby achieving manufacturing cost reduction. Further, according to a conventional formation of cell capacitors, storage electrodes and capacitance dielectric films are formed within deep cylinder holes, and interlayer dielectric films need to be embedded into the cylinder holes. However, according to the first embodiment, because cell capacitors are formed in a space between bit lines, interlayer dielectric films do not need to be embedded into the cylinder holes. Consequently, deterioration of the productivity due to insufficient embedding can be prevented.

A manufacturing method of the DRAM memory cell 100 according to the first embodiment is explained in detail next.

FIG. 6 to FIG. 25 are schematic cross-sectional views showing a manufacturing process of the DRAM memory cell 100 according to the first embodiment. Specifically, letters A, B, and C attached to each drawing represent cross-sectional views along a line A-A', a line B-B', and a line C-C' in FIG. 3, respectively.

Figures 6A, 6B, 6C:
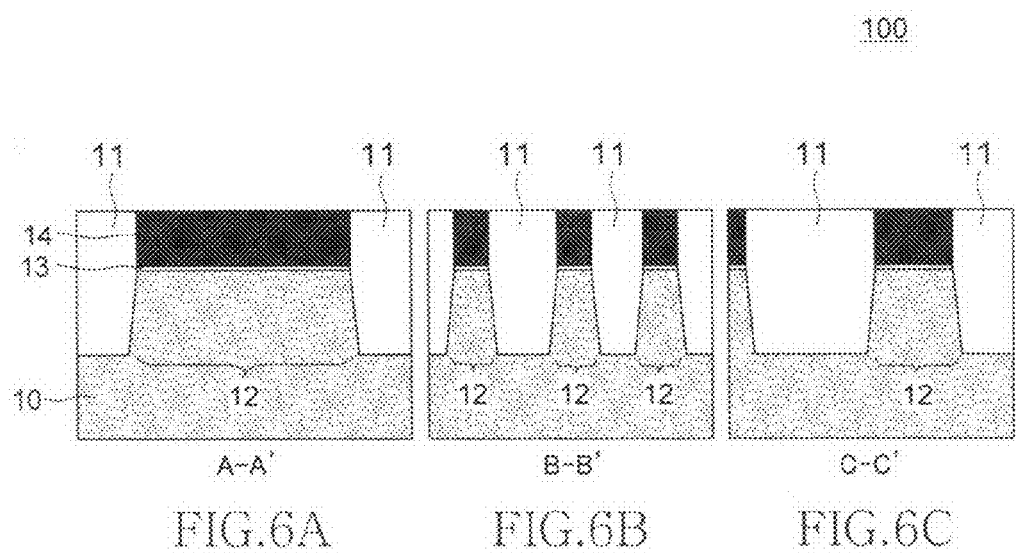
FIG. 6A to FIG. 6C are schematic cross-sectional views showing a manufacturing process (forming active regions 12) of the DRAM memory cell 100.

As shown in FIGS. 6A to 6C, in manufacturing the DRAM memory cell 100 according to the first embodiment, the STI 11 are formed on the semiconductor substrate 10 such as a P-type silicon substrate, thereby partitioning plural active regions 12 dielectrically isolated by the STI 11. In the formation of the STI 11, a silicon oxide film (a pad oxide film) 13 and a silicon nitride film (a field nitride film) 14 are formed sequentially on the semiconductor substrate 10. The field nitride film 14 is selectively removed by photolithography and dry etching. The pad oxide film 13 and the semiconductor substrate 10 are dry etched by using the field nitride film 14 as a mask, thereby forming element isolation trenches having a depth of about 200 nm to 350 nm.

Next, a silicon oxide film (not shown) having a small thickness of about 5 nm is formed as a ground film on an internal wall surface of the element isolation trenches, by thermal oxidation at about 1,000° C. Thereafter, a silicon oxide film (a field oxide film) having a thickness of about 400 nm to 500 nm is deposited by a CVD method on the entire surface of the semiconductor substrate 10 including the inside of the element isolation trenches. After the field oxide film is embedded into the element isolation trenches in this way, the field oxide film is polished and flattened by using the field nitride film as a CMP (Chemical Mechanical Polishing) stopper, thereby completing the STI 11 and the active regions 12 as shown in FIGS. 6A to 6C.

Because the active regions 12 need to be arranged at a pitch of about F relative to the minimum feature size F, each active region 12 needs to be divided into two patterns having a 2F pitch, and each pattern needs to be formed by double exposure or by a two-time exposure process.

Figures 7A, 7B, 7C:
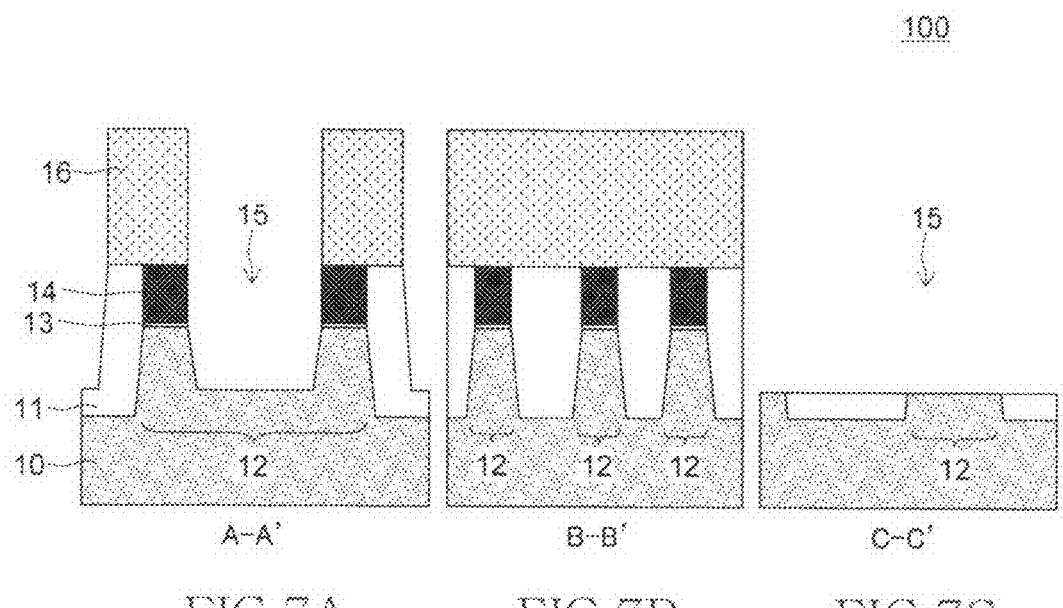
FIG. 7A to FIG. 7C are schematic cross-sectional views showing a manufacturing process (forming gate trenches 15) of the DRAM memory cell 100.

Next, as shown in FIGS. 7A to 7C, the gate trenches 15 are formed. In forming the gate trenches 15, a photoresist 16 is formed first, and this photoresist 16 is patterned by exposing and developing the photoresist. The field nitride film 14 is then selectively removed by dry etching by using the patterned photoresist 16 as a mask. Further, the pad oxide film 13, the semiconductor substrate 10, and the field oxide film of the STI 11 in the active regions 12 are selectively removed by dry etching. At this time, the gate trenches 15 are formed in the STI 11 as well as in the active regions 12. As a result, the gate trenches 15 become in straight line patterns extended in the Y direction (see FIG. 3). FIG. 7C shows a state that the gate trenches 15 are formed in the STI 11 as well as in the active regions 12. The gate trenches 15 as shown in FIGS. 7A to 7C are completed by the above process. At this time, the gate trenches 15 are in stripe patterns of a 2F pitch as shown in FIG. 3. As shown in FIGS. 7A to 7C, the semiconductor substrate 10 in the active regions 12 divided by the gate trenches 15 has two pillar shapes. Diffusion layers of cell transistors are formed on an upper part of each pillar and at a center of a bottom of each gate trench 15.

Next, as shown in FIGS. 8A to 8C, the photoresist 16 is removed, and the gate dielectric film 17 having a thickness of about 5 nm is formed by thermal oxidation on an internal wall surface of the gate trenches 15. At this time, the gate dielectric film 17 is formed on the entire surface of the internal wall surface of the gate trenches 15. Thereafter, the gate electrodes (word lines) 18a and 18b that cover only the left and right side surfaces of the internal wall surface of the gate trenches 15 are formed. The gate electrodes 18a and 18b can be formed by forming a conductive film for gate electrodes on the entire surface of the substrate including the inside of the gate trenches 15, and by etching back this conductive film. At this time, the gate electrodes 18a and 18b are formed on the STI 11 as well as in the active regions 12. As a result, the gate electrodes 18a and 18b become in linear patterns extended in the Y direction (see FIG. 4). FIG. 8C does not show the gate electrodes 18a and 18b because FIG. 8C is a cross-sectional view obtained by cutting the gate trenches 15 at the center. For the conductive film for gate electrodes, a single-layer film of a polycrystalline silicon film as well as a multilayer film containing a high melting-point metal such as tungsten and its compound can be also used. Most preferably, a multilayer film obtained by sequentially laminating a polycrystalline silicon film, a tungsten silicide film, a tungsten nitride film, and a tungsten film is used for the conductive film for gate electrodes.

Figures 9A, 9B, 9C:
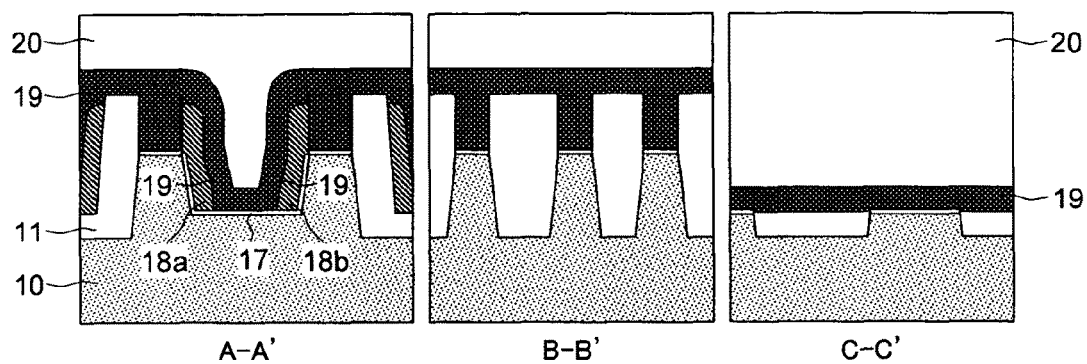
FIG. 9A to FIG. 9C are schematic cross-sectional views showing a manufacturing process (forming gate-cap dielectric film 19) of the DRAM memory cell 100.

Next, as shown in FIGS. 9A to 9C, a silicon nitride film (the gate-cap dielectric film) 19 having a thickness of about 20 nm is formed on the entire surface of the substrate by the CVD method, and an interlayer dielectric film 20 having a thickness of about 100 nm is formed. The interlayer dielectric film 20 is embedded into the gate trenches 15, and a surface of the interlayer dielectric film 20 is polished and flattened by CMP. BPSG (Boro-Phospho Silicate Glass) can be used for the interlayer dielectric film 20, and this film can be formed by the CVD method.

Figures 10A, 10B, 10C:
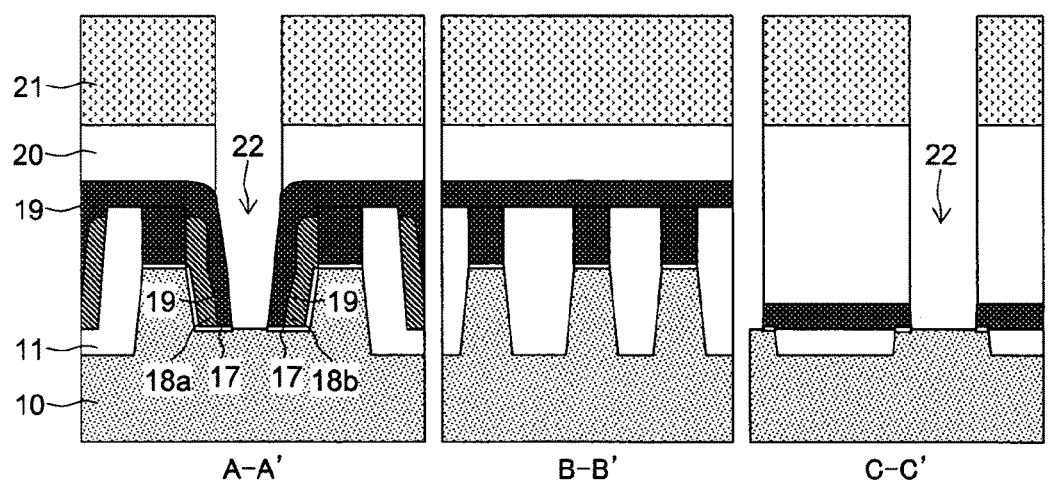
FIG. 10A to FIG. 10C are schematic cross-sectional views showing a manufacturing process (forming bit-line contact holes 22) of the DRAM memory cell 100.

Next, as shown in FIGS. 10A to 10C, bit-line contact holes 22 are formed. In forming the bit-line contact holes 22, a photoresist 21 is first formed, and this is exposed and developed, thereby patterning the photoresist 21. The interlayer dielectric film 20 and the gate-cap dielectric film 19 are sequentially removed by dry etching by using the patterned photoresist 21 as a mask. The gate dielectric film 17 formed on the bottom surface of the gate trenches 15 is removed, thereby exposing the semiconductor substrate 10. The bit-line contact holes 22 as shown in FIGS. 10A to 10C are formed by the above process.

Figures 11A, 11B, 11C:
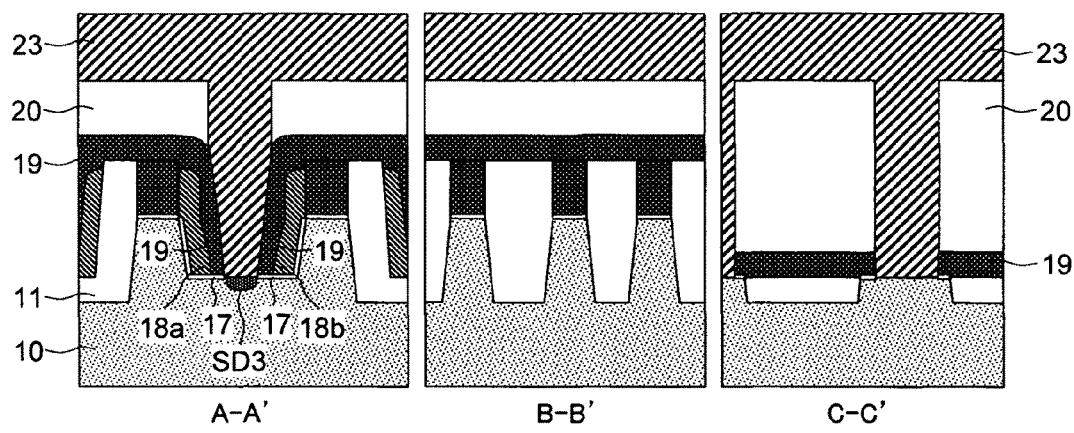
FIG. 11A to FIG. 11C are schematic cross-sectional views showing a manufacturing process (forming bit-line contact plugs 23) of the DRAM memory cell 100.

Next, as shown in FIGS. 11A to 11C, the photoresist 21 is removed, and the bit-line contact plug 23 is formed thereafter. The bit-line contact plug 23 can be formed by embedding a conductive material such as DOPOS (Doped Poly-Silicon) on the entire surface of the substrate including the inside of the bit-line contact holes 22. Impurity contained in the bit-line contact plug 23 is diffused to the semiconductor substrate 10 constituting the bottom surface of the gate trenches 15, and becomes the source/drain diffusion layer SD3. Alternatively, before the bit-line contact plug 23 is formed, the source/drain diffusion layer SD3 can be formed on the bottom surface of the gate trenches 15 by ion implantation via the bit-line contact holes 22.

Figures 12A, 12B, 12C:
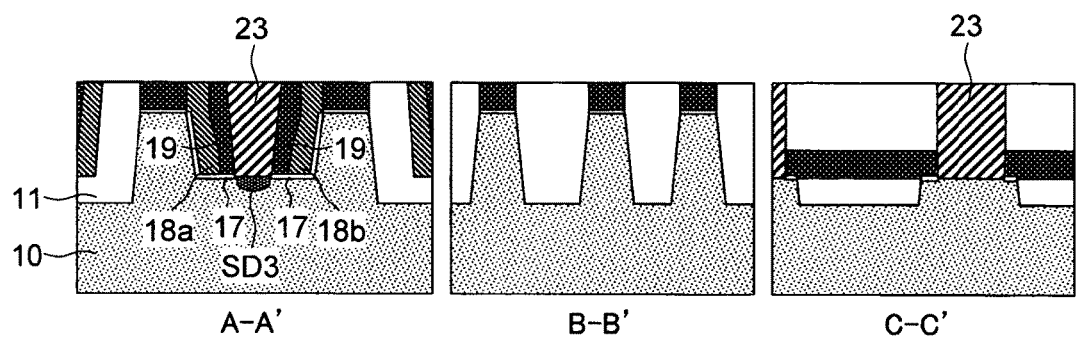
FIG. 12A to FIG. 12C are schematic cross-sectional views showing a manufacturing process (polishing by CMP) of the DRAM memory cell 100.

Next, as shown in FIGS. 12A to 12C, an unnecessary layer formed on the semiconductor substrate 10 is removed by polishing this layer by CMP. Specifically, a conductive film for the bit-line contact plug 23 and the interlayer dielectric film 20 are polished by CMP by using the gate-cap dielectric film 19 as a CMP stopper. The gate-cap dielectric film 19 is polished next by using as a CMP stopper the field oxide film constituting the STI 11. As a result, upper ends of the gate electrodes 18a and 18b can be exposed as shown in FIGS. 12A to 12C.

Figures 13A, 13B, 13C:
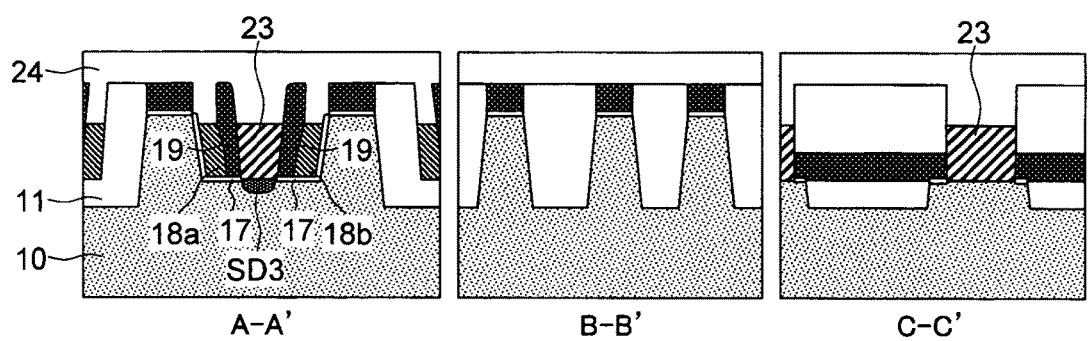
FIG. 13A to FIG. 13C are schematic cross-sectional views showing a manufacturing process (forming an interlayer dielectric film 24) of the DRAM memory cell 100.

Next, as shown in FIGS. 13A to 13C, upper parts of the gate electrodes 18a and 18b are removed by etching back the upper parts to set upper end positions of the gate electrodes 18a and 18b to lower than the surface of the semiconductor substrate 10 within the active regions 12. Thereafter, an interlayer dielectric film 24 having a thickness of about 100 nm is formed on the entire surface of the substrate including a cavity portion after the upper parts of the gate electrodes 18a and 18b are removed. The upper parts of the gate electrodes 18a and 18b are removed to secure insulation between a silicon epitaxial layer formed thereafter and the gate electrodes 18a and 18b. An SOG (Spin on Glass) film can be used for the interlayer dielectric film 24.

Figure 14A:
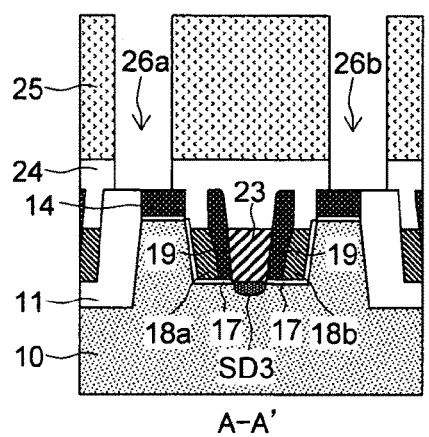
FIG. 14A to FIG. 14C are schematic cross-sectional views showing a manufacturing process (forming capacitance contact holes 26a and 26b) of the DRAM memory cell 100.
Figure 14B:
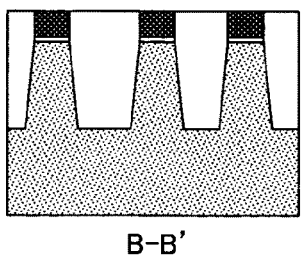
Figure 14C:
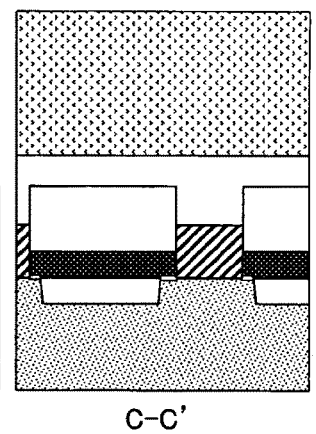

Next, as shown in FIGS. 14A to 14C, capacitance contact holes (storage-node contact holes) 26a and 26b piercing through the interlayer dielectric film 24 are formed. Positions at which the capacitance contact holes 26a and 26b are formed in a plan view direction correspond to the storage areas 40c shown in FIG. 3 and FIG. 4. The capacitance contact holes 26a and 26b are formed near both ends of the active regions 12, and in regions including these portions. As a result, a part of the field nitride film 14 left at both ends of the active regions 12 becomes an exposed state.

Figures 15A, 15B, 15C:
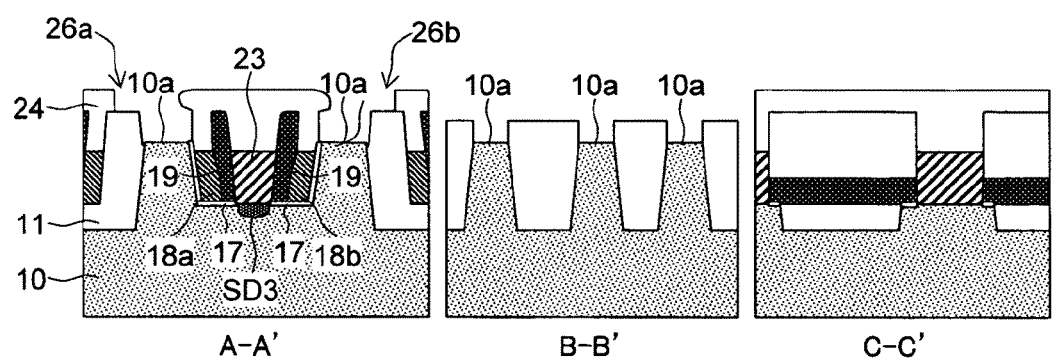
FIG. 15A to FIG. 15C are schematic cross-sectional views showing a manufacturing process (removing a field nitride film 14) of the DRAM memory cell 100.

Next, as shown in FIGS. 15A to 15C, the field nitride film 14 exposed by the formation of the capacitance contact holes 26a and 26b and the pad oxide film 13 beneath the field nitride film 14 are removed, thereby exposing a surface 10a of the semiconductor substrate 10 within the active region 12.

Figures 16A, 16B, 16C:
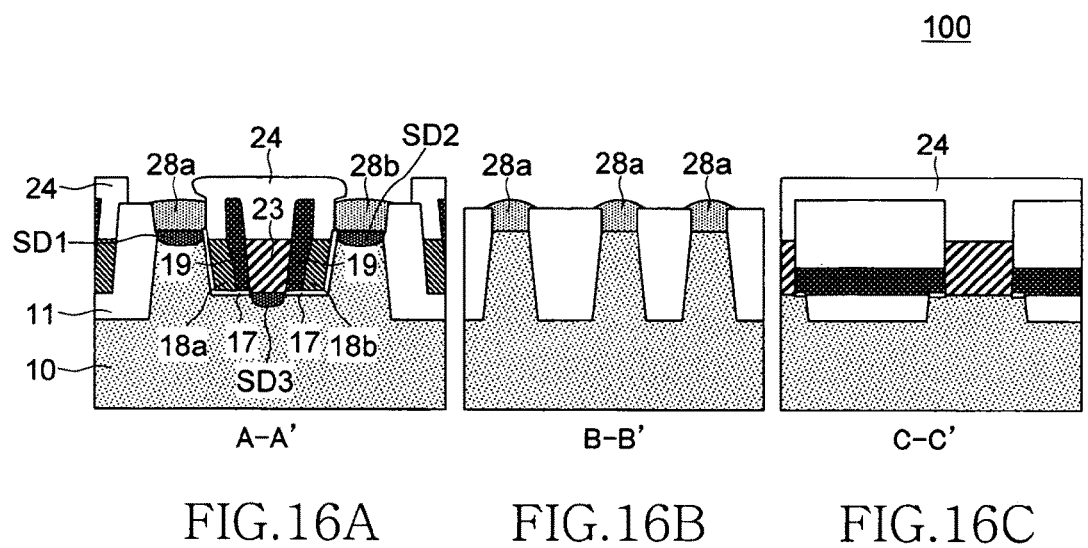
FIG. 16A to FIG. 16C are schematic cross-sectional views showing a manufacturing process (forming silicon epitaxial layers 28a and 28b) of the DRAM memory cell 100.

Next, as shown in FIGS. 16A to 16C, the silicon epitaxial layers 28a and 28b are formed by a selective epitaxial growth method on the surface (an exposed surface) 10a of the semiconductor substrate 10 within the active region 12. Preferably, the silicon epitaxial layers 28a and 28b contain n-type impurity such as phosphorus (P) and arsenic (As). When these silicon epitaxial layers 28a and 28b are provided, n-type impurity in the silicon epitaxial layers 28a and 28b is diffused within the semiconductor substrate 10 beneath these layers by subsequent thermal processing. Therefore, the source/drain diffusion layers SD1 and SD2 of MOS transistors can be formed within the semiconductor substrate 10. Before the silicon epitaxial layers 28a and 28b are formed, an impurity diffusion process can be performed to ion-implant n-type impurity into the exposed surface 10a of the semiconductor substrate within the active regions 12. By performing this process, two source/drain diffusion layers SD1 and SD2 are formed at both sides of each active region 12 via the gate trench 15.

Figures 17A, 17B, 17C:
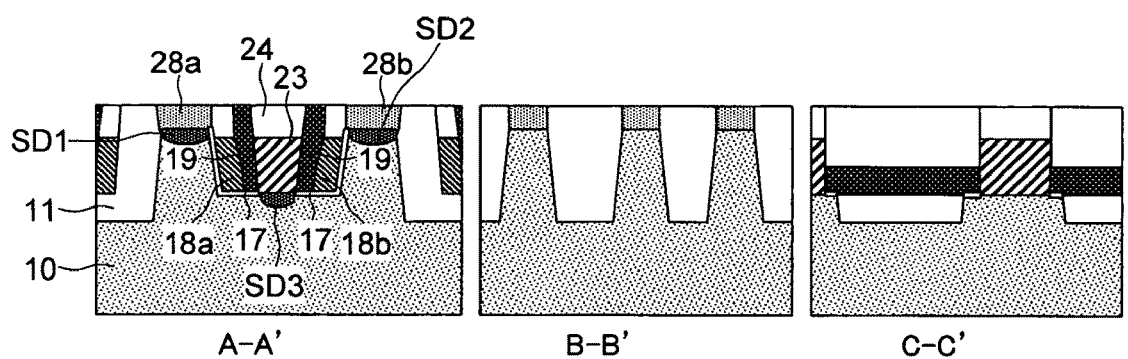
FIG. 17A to FIG. 17C are schematic cross-sectional views showing a manufacturing process (polishing by CMP) of the DRAM memory cell 100.
Figures 18A, 18B, 18C:
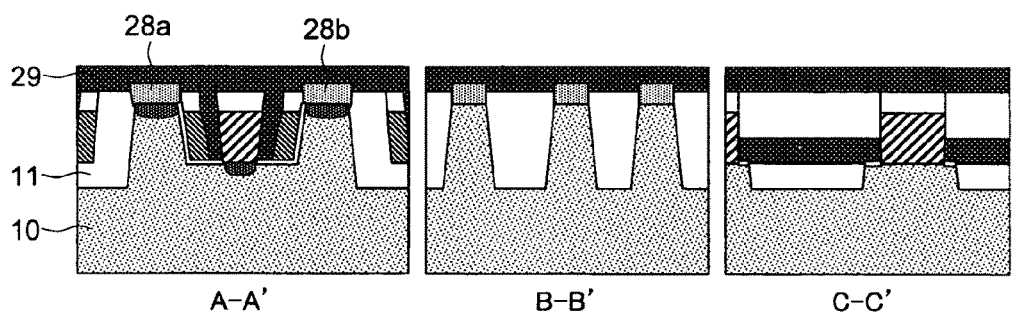
FIG. 18A to FIG. 18C are schematic cross-sectional views showing a manufacturing process (forming a protective dielectric film 29) of the DRAM memory cell 100.

Next, as shown in FIGS. 17A to 17C, an uneven surface of the interlayer dielectric film 24 due to the formation of the capacitance contact holes 26a and 26b is flattened by CMP. Thereafter, as shown in FIGS. 18A to 18C, a silicon oxide film exposed to the surface of the substrate is slightly removed by etching back this film, and a silicon nitride film (a protective dielectric film) 29 is formed on a resultant surface.

Figures 19A, 19B, 19C:
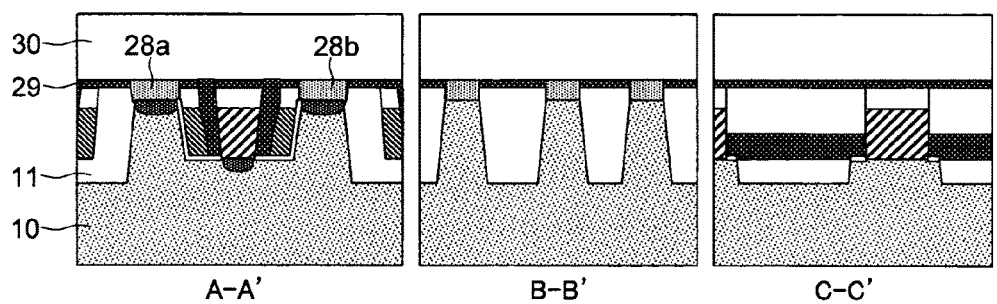
FIG. 19A to FIG. 19C are schematic cross-sectional views showing a manufacturing process (forming interlayer dielectric film 30) of the DRAM memory cell 100.

Next, as shown in FIGS. 19A to 19C, a substrate surface having only the protective dielectric film 29 and the silicon epitaxial layers 28a and 28b exposed is formed by polishing the protective dielectric film 29 by using the silicon epitaxial layers 29a and 28b as CMP stoppers. Thereafter, the interlayer dielectric film 30 having a thickness of about 100 nm is formed. This interlayer dielectric film 30 dielectrically isolates a transistor layer from a bit line layer. A silicon oxide film can be used for the interlayer dielectric film 30.

Figures 20A, 20B, 20C:
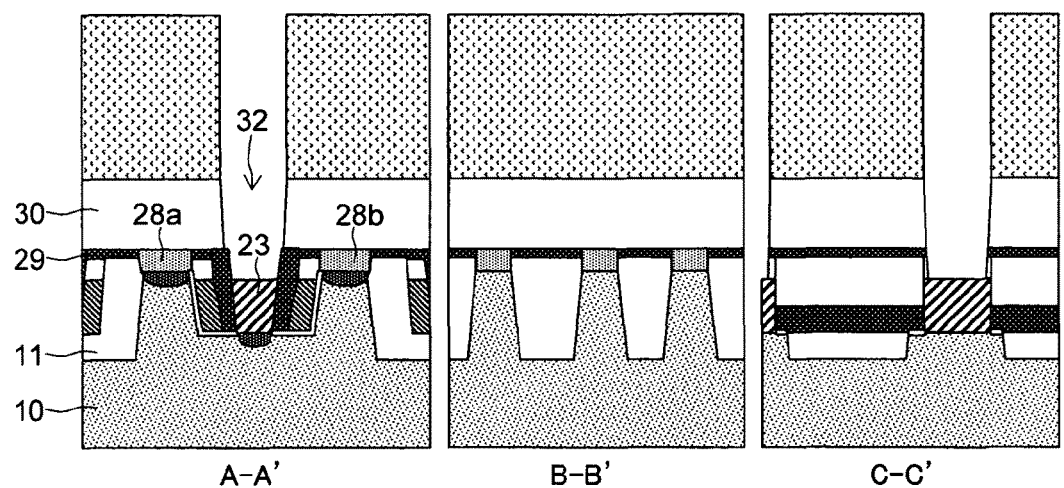
FIG. 20A to FIG. 20C are schematic cross-sectional views showing a manufacturing process (forming bit-line contact holes 32) of the DRAM memory cell 100.

Next, as shown in FIGS. 20A to 20C, a bit-line contact hole 32 is formed immediately above each bit-line contact plug 23 already formed in each gate trench 15. In forming the bit-line contact hole 32, a photoresist 31 is first formed, and this is exposed and developed, thereby forming an open pattern. The interlayer dielectric film 30, the protective dielectric film 29, and the interlayer dielectric film 24 are sequentially removed by dry etching by using the photoresist 31 as a mask, thereby exposing an upper surface of the bit-line contact plug 23. As a result, the bit-line contact hole 32 as shown in FIGS. 20A to 20C is formed.

Figures 21A, 21B, 21C:
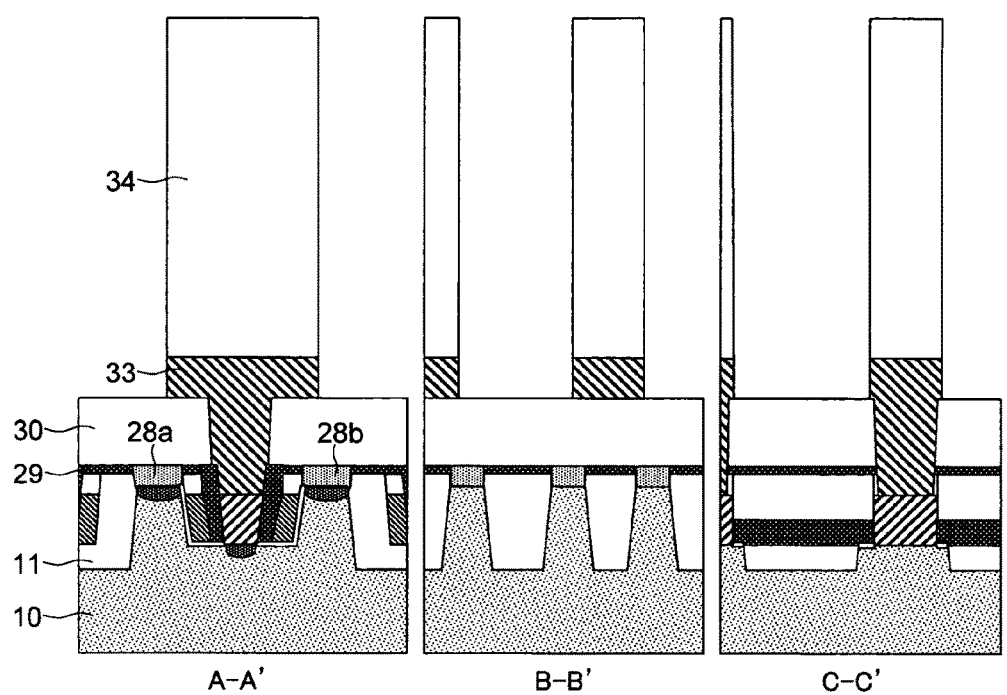
FIG. 21A to FIG. 21C are schematic cross-sectional views showing a manufacturing process (forming bit lines 33 and bit-line cap dielectric films 34) of the DRAM memory cell 100.

Next, as shown in FIGS. 21A to 21C, a laminated film (a conductive film for bit lines) of titanium nitride (TiN) and tungsten (W) is formed in a thickness of 50 nm on the entire surface of the substrate including the inside of the bit-line contact hole 32. Thereafter, a silicon oxide film (a bit-line cap dielectric film) having a thickness of about 1 μm to 2 μm is formed by the CVD method on a surface of the conductive film for bit lines. Thereafter, the bit-line cap dielectric film is removed by dry etching, and the conductive film for bit lines is removed by dry etching. As a result, the bit line 33 and the bit-line cap dielectric film 34 linearly patterned along the X direction are completed. At this time, the bit line 33 and the bit-line cap dielectric film 34 are in stripe patterns of 2F pitch shown in FIG. 3. The conductive film for bit lines does not need to be a DOPOS film but can be a multilayer film containing a high melting-point metal.

Figures 22A, 22B, 22C:
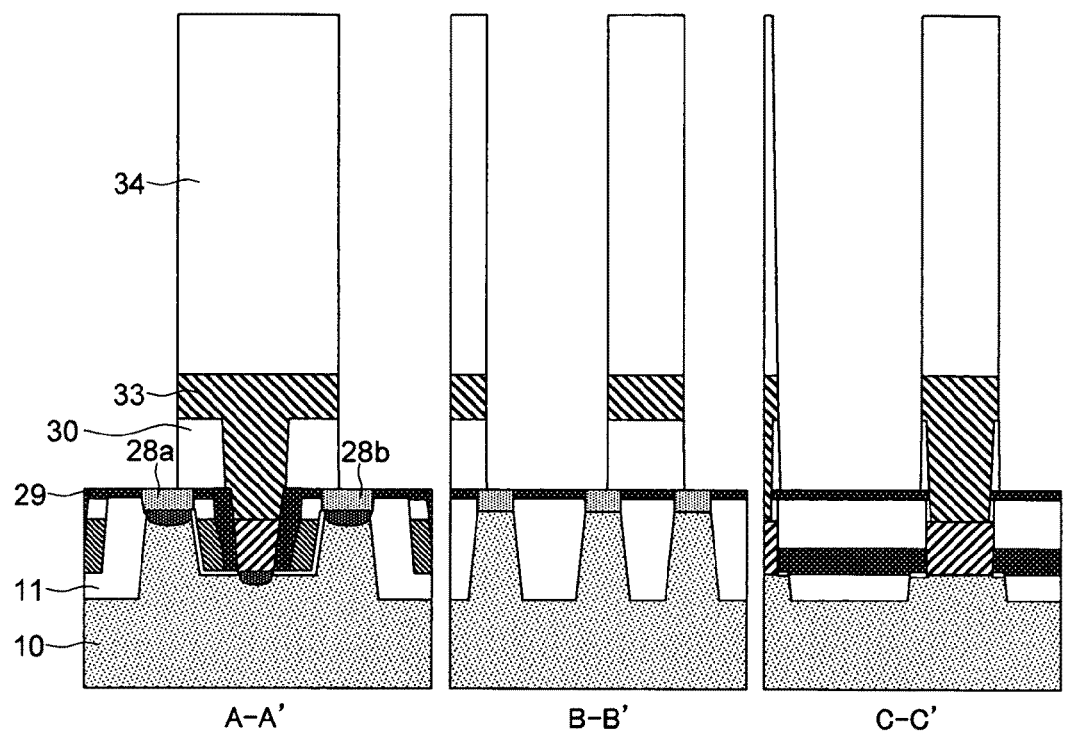
FIG. 22A to FIG. 22C are schematic cross-sectional views showing a manufacturing process (removing interlayer dielectric film 30) of the DRAM memory cell 100.

Next, as shown in FIGS. 22A to 22C, the interlayer dielectric film 30 is removed by dry etching by using the bit-line cap dielectric film 34 as a mask. As a result, the silicon epitaxial layers 28a and 28b formed at both ends of the active region 12 are exposed.

Figures 23A, 23B, 23C:
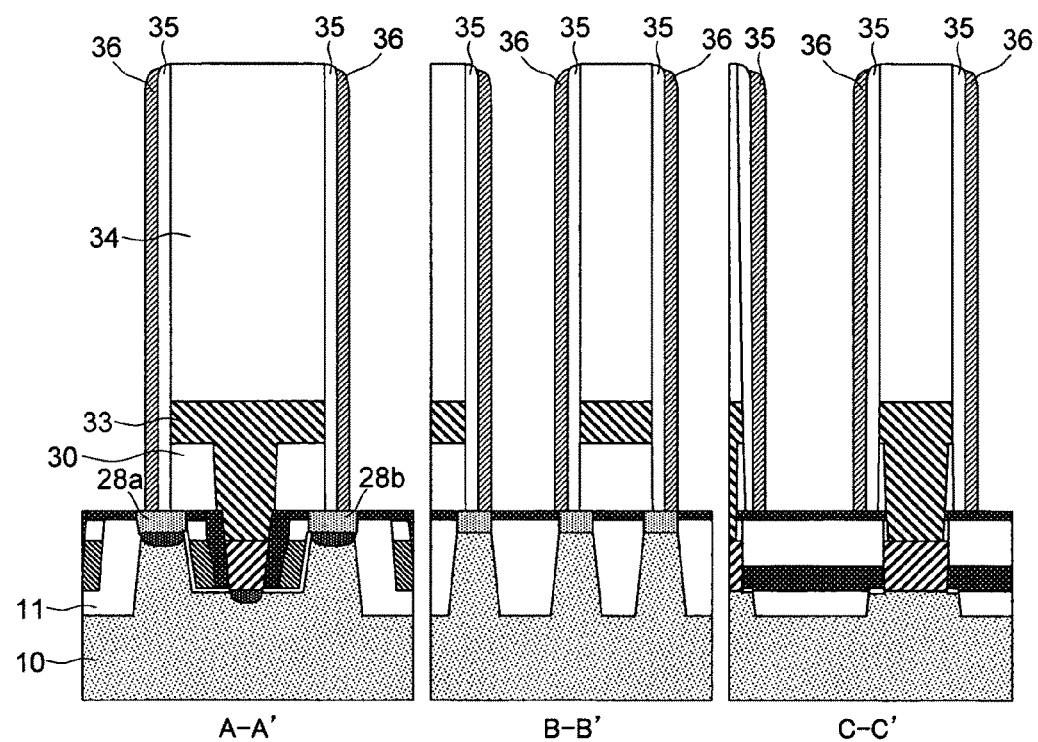
FIG. 23A to FIG. 23C are schematic cross-sectional views showing a manufacturing process (forming conductive films 36 for storage electrodes) of the DRAM memory cell 100.

Next, as shown in FIGS. 23A to 23C, the sidewall dielectric film 35 is formed on a side surface of a laminated film including the interlayer dielectric film 30, the bit line 33, and the bit-line cap dielectric film 34. The sidewall dielectric film 35 can be formed by forming a silicon oxide film having a small thickness equal to or smaller than 10 nm on the entire surface of the substrate, and by etching back this silicon oxide film. A conductive film for a storage electrode of a cell capacitor is formed, and this conductive film is etched back to keep the conductive film 36 for a storage electrode on only a surface (a side surface) of the sidewall dielectric film. A lower end of the conductive film 36 for a storage electrode is in contact with the silicon epitaxial layers 28a and 28b. At this time, the conductive film 36 for a storage electrode is formed on the entire surface of a side surface of a stage of a bit line and the like along the X direction. Therefore, FIG. 23C as a cross-sectional view along the line C-C' shows the conductive film 36 for a storage electrode.

Figures 24A, 24B, 24C:
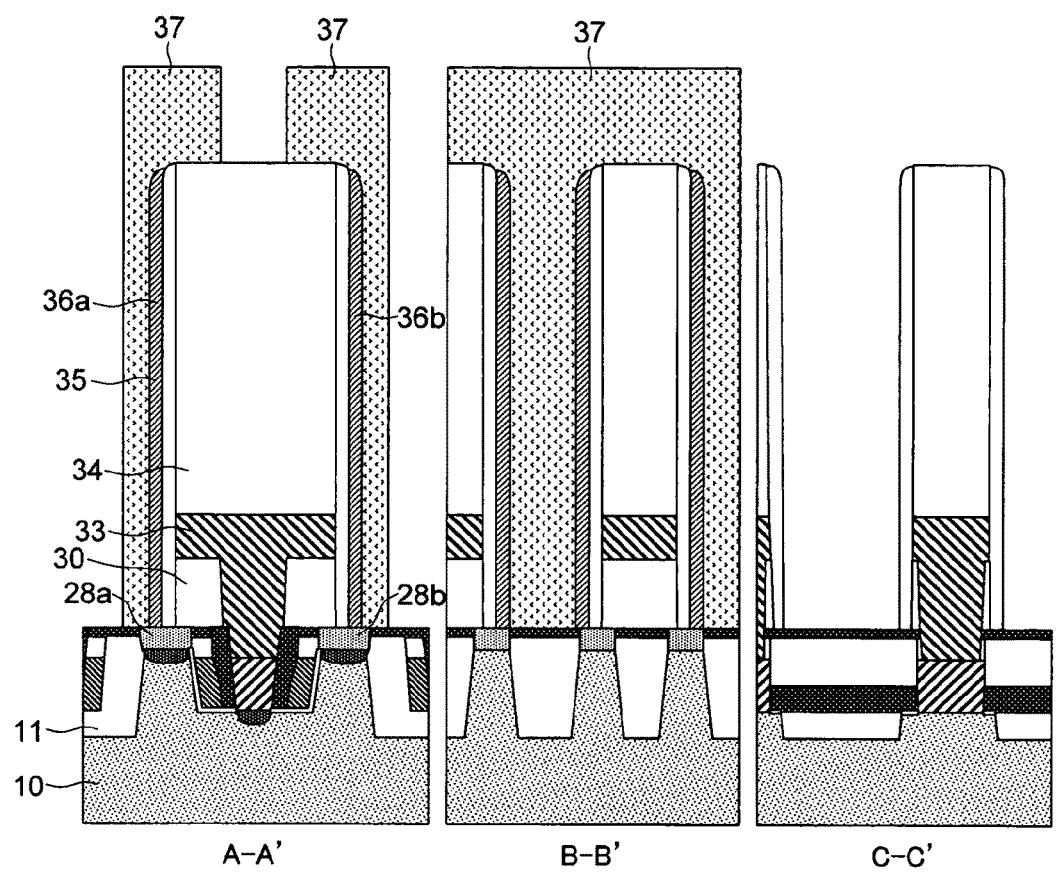
FIG. 24A to FIG. 24C are schematic cross-sectional views showing a manufacturing process (patterning conductive films 36 for storage electrodes) of the DRAM memory cell 100.

Next, as shown in FIGS. 24A to 24C, the conductive film 36 for a storage electrode is selectively removed by dry etching this conductive film by using a photoresist 37, thereby keeping the conductive film 36 for a storage electrode only above both ends of the active region 12. The photoresist 37 patterned to keep the storage area 40c shown in FIG. 3 is used in this case. FIG. 24C as a cross-sectional view along the line C-C' does not show the conductive film 36 for a storage electrode because the conductive film 36 for a storage electrode other than that of both ends of the active region 12 is removed. The conductive film 36 for a storage electrode is divided into two of the storage electrodes 36a and 36b by the above process.

Figures 25A, 25B, 25C:
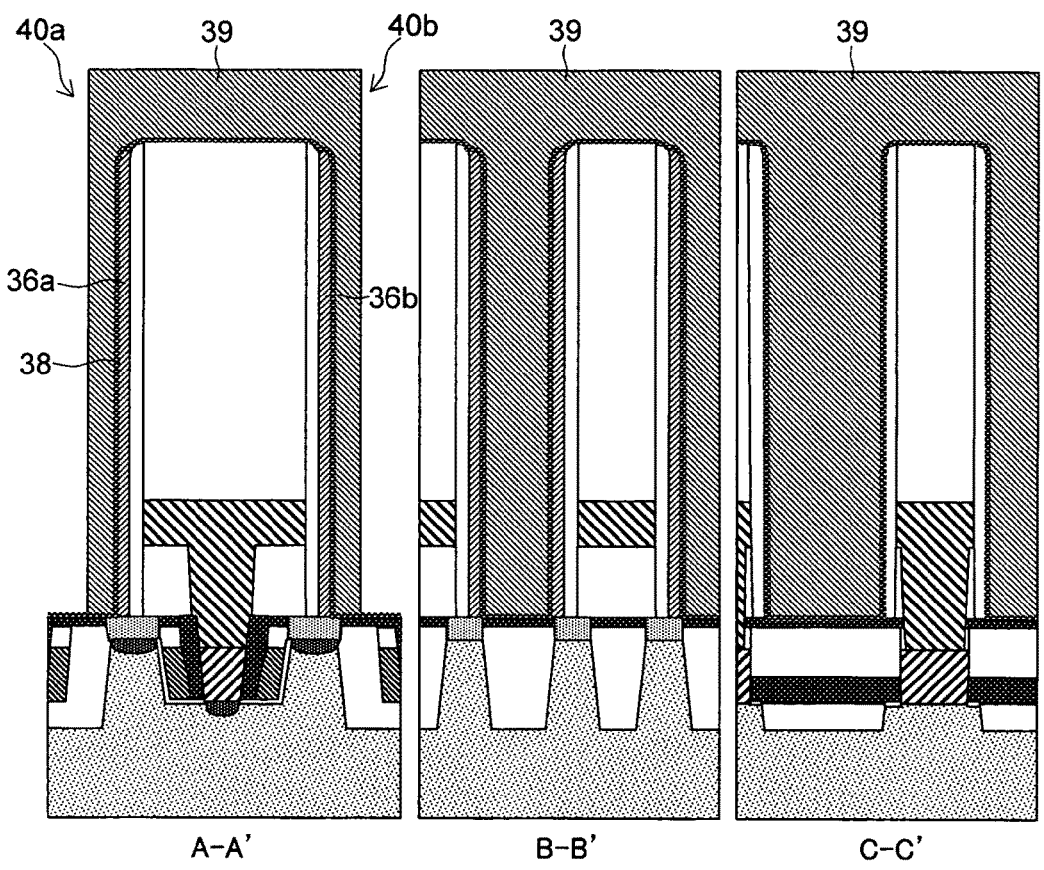
FIG. 25A to FIG. 25C are schematic cross-sectional views showing a manufacturing process (forming capacitance dielectric films 38 and a common plate electrode 39) of the DRAM memory cell 100.

Next, as shown in FIGS. 25A to 25C, the capacitance dielectric film 38 is formed in a thickness of about 7 nm on the entire surface of the substrate, and the common plate electrode 39 is formed on the entire surface. Thereafter, a wiring pattern (not shown) is formed on memory cells, thereby completing a DRAM memory array ARY.

According to the manufacturing method of a semiconductor memory device explained above, a semiconductor memory device including memory cells having a cell area of $2F^2$ can be manufactured.

Figures 26A, 26B, 26C:
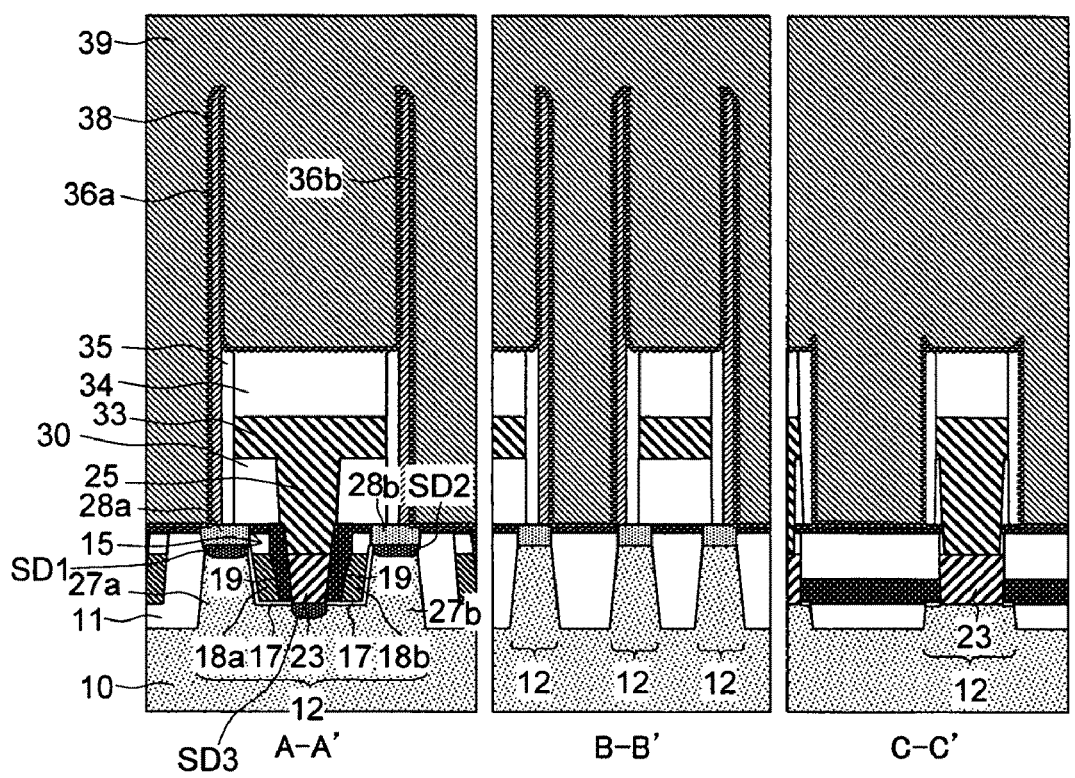
FIG. 26A to FIG. 26C are cross sectional views of a DRAM memory cell 200 along a line A-A', a line B-B', and a line C-C' in FIG. 3, respectively.

FIGS. 26A to 26C show schematic cross-sectional views of a configuration of a semiconductor memory device according to a second embodiment of the present invention. FIGS. 26A to 26C show cross-sectional views along the line A-A', the line B-B', the line C-C' in FIG. 4, respectively, in a similar manner to that in FIGS. 25A to 25C.

As shown in FIGS. 26A to 26C, according to a semiconductor memory device 200 of the second embodiment, the bit-line cap dielectric film 34 has a smaller height than those of the storage electrodes 36a and 36b. Therefore, the storage electrodes 36a and 36b can have a larger surface area. The storage electrodes 36a and 36b initially have the same height as that of the bit-line cap dielectric film 34, and thereafter have larger heights by dry etching the bit-line cap dielectric film 34. Thereafter, the capacitance dielectric film 38 is formed on the entire surface of the substrate, thereby forming this film on both sides of projections of the storage electrodes 36a and 36b. Other configurations of the semiconductor memory device 200 are substantially the same as those of the semiconductor memory device 100 according to the first embodiment, and thus like constituent elements are denoted by like reference numerals and detailed explanations thereof will be omitted.

As explained above, according to the second embodiment, the storage electrodes can have a larger surface area than that in the first embodiment, and a cell capacitor having large charge storage capacitance can be configured. Therefore, a refresh characteristic of a DRAM can be further improved.

It is apparent that the present invention is not limited to the above embodiments, but may be modified and changed without departing from the scope and spirit of the invention.

For example, while a MIS capacitor using HSG-Si for a storage electrode is explained in the above embodiments, the present invention can be also applied to a MIM (Metal Insulator Metal) capacitor. When the MIM capacitor is used, a metal material such as titanium nitride is used to form a storage electrode by the CVD method, and aluminum oxide and hafnium oxide are used to form a capacitance dielectric film by an ALD method, thereby obtaining much larger capacitance than that of the MIS capacitor. Needless to mention, titanium silicide needs to be formed at an interface between titanium nitride and silicon below this titanium nitride.

While a storage element is a capacitor, that is, while a DRAM is explained as a semiconductor memory device in the above embodiments, a semiconductor memory device is not limited to a DRAM in the present invention. The invention can be also applied to a nonvolatile semiconductor memory device (a PRAM) using a phase change element. When the present invention is applied to a PRAM, a portion of a cell capacitor as a memory element is replaced by a phase change element. That is, the memory element is configured by a lower electrode connected to the silicon epitaxial layers 28a and 28b, a recording layer provided in contact with the lower electrode, and a common plate electrode provided in contact with the recording layer. A phase change material is used for the recording layer.

The phase change material is not particularly limited when the material has two or more phase states and also when electric resistance is different depending on a phase state. Preferably, a calcogenide material is selectively used for the phase change material. The calcogenide material is an alloy containing at least one of elements of germanium (Ge), antimony (Sb), tellurium (Te), indium (In), selenium (Se). For example, there are an element of a binary system such as GaSb, InSb, InSe, $Sb_2Te_3$, and GeTe, an element of three systems such as $Ge_2Sb_2Te_5$, InSbTe, GaSeTe, $SnSb_2Te_4$, and InSbGe, and an element of four systems such as AgInSbTe, (GeSn)Sbte, GeSb(SeTe), and $Te_{81}Ge_{15}Sb_2S_2$. Most preferably, $Ge_2Sb_2Te_5$(GST) is selected.

A lower electrode is used for a heater plug, and this becomes apart of a heater at a data writing time. Preferably, a material having relatively high electric resistance, such as metal silicide, metal nitride, and metal silicide nitride is used for the lower electrode. While not particularly limited, it is preferable to use a high melting-point metal such as W, TiN, TaN, WN, and TiAlN and a nitride of the metal, or a nitride of high-melting-point metal silicide such as TiSiN and WSiN, or a material such as TiCN. For the common plate electrode, a material such as TiAlN, TiSiN, and TiCN is preferably used, like the lower electrode.

In addition, while not specifically claimed in the claim section, the applicant reserves the right to include in the claim section of the application at any appropriate time the following methods:

A. A manufacturing method of a semiconductor memory device comprising:
forming an active region on a semiconductor substrate surrounded by an isolation region;
forming a gate trench in the semiconductor substrate crossing the active region;
forming first and second gate electrodes on both side surfaces of the gate trench via gate dielectric films, respectively;
forming first and second diffusion layers within the active region positioned at both sides of the gate trench;
forming a third diffusion layer on a bottom surface of the gate trench;

forming a bit line electrically connected to the third diffusion layer; and forming first and second memory elements electrically connected to the first and second diffusion layers, respectively.

B. The manufacturing method of a semiconductor memory device as claimed in claim A, wherein forming the first and second gate electrodes includes:

forming a conductive film within the gate trench; and etching back the conductive film so as to remain the first and second gate electrodes on both side surfaces of the gate trench, respectively.

C. The manufacturing method of a semiconductor memory device as claimed in claim B, further comprising:

forming a gate-cap dielectric film that covers the first and second gate electrodes after etching back the conductive film; and exposing the bottom surface of the gate trench by etching the gate-cap dielectric film.

D. The manufacturing method of a semiconductor memory device as claimed in claim C, further comprising forming a bit-line contact plug which is in contact with the bottom surface of the gate trench after exposing the bottom surface of the gate trench, wherein forming the bit line is performed by forming the bit line above the gate trench so that the bit line is in contact with the bit-line contact plug.

E. The manufacturing method of a semiconductor memory device as claimed in claim A, further comprising:

forming a bit-line cap dielectric film that covers the bit line after forming the bit line; and forming a sidewall dielectric film that covers a side surface of the bit line and the bit-line cap dielectric film, wherein forming the first and second memory elements is performed by forming the first and second memory elements to cover the sidewall dielectric film.

F. The manufacturing method of a semiconductor memory device as claimed in claim E, wherein forming the first and second memory elements includes:

forming a storage electrode that covers the sidewall dielectric film; and separating the storage electrode into a section for the first memory element and another section for the second memory element by patterning the storage electrode.

G. The manufacturing method of a semiconductor memory device as claimed in claim F, wherein forming the first and second memory elements further includes:

forming a capacitance dielectric film that covers the storage electrode; and forming a plate electrode that covers the storage electrode via the capacitance dielectric film.

What is claimed is:

1. A semiconductor memory device comprising:
an active region formed with a gate trench having mutually opposite first and second side surfaces and a bottom surface, the active region having first and second diffusion layers positioned at both sides of the gate trench and a third diffusion layer formed on the bottom surface of the gate trench;
a first storage electrode connecting electrically to the first diffusion layer;
a second storage electrode connecting electrically to the second diffusion layer;
a capacitance dielectric film covering the first and second storage electrodes;
a plate electrode covering the capacitance dielectric film;
a bit line electrically connected to the third diffusion layer;

a first gate electrode that covers the first side surface of the gate trench via a first gate dielectric film, the first gate electrode producing a channel between the first diffusion layer and the third diffusion layer; and a second gate electrode that covers the second side surface of the gate trench via a second gate dielectric film, the second gate electrode producing a channel between the second diffusion layer and the third diffusion layer, wherein the plate electrode extends downwardly beyond a bottom surface of the bit line wherein the bit line is disposed above the first and second diffusion layers, the semiconductor memory device further comprising:

a bit line cap dielectric film disposed over the bit line and having first and second side surfaces, the first and second side surfaces being placed in the opposite side of the bit line, and wherein the plate electrode covers the first and second side surfaces of the bit line cap dielectric film.

2. The semiconductor memory device as claimed in claim 1, wherein upper surfaces of the first and second storage electrodes are higher than an upper surface of the bit-line cap dielectric film.

3. The semiconductor memory device as claimed in claim 1, further comprising:

a bit-line contact plug that electrically connects the third diffusion layer and the bit line; and gate-cap dielectric films that electrically insulate the bit-line contact plug from the first and second gate electrodes, wherein at least a part of the gate-cap dielectric films is provided within the gate trench.

4. The semiconductor memory device as claimed in claim 1, wherein, when a layout pitch of the gate trenches and a layout pitch of the bit lines are 2F (F is the minimum feature size), a plane area occupying a minimum memory unit is equal to or smaller than $2F^2$.

5. A semiconductor memory device comprising:
a semiconductor substrate provided with a plurality of gate trenches each extended in a first direction and having mutually opposite first and second side surfaces and a bottom surface;
a plurality of bit lines each extended in a second direction substantially orthogonal to the first direction;
a plurality of first word lines each provided along the first side surface of corresponding one of the gate trenches;
a plurality of second word lines each provided along the second side surface of corresponding one of the gate trenches;
a plurality of active regions each provided on the semiconductor substrate at each intersection of the gate trench and the bit line, each of the active regions having a center section crossed by corresponding one of the gate trenches;
a plurality of first and second diffusion layers provided in the active regions, each pair of the first and second diffusion layers being positioned at both sides of corresponding one of the gate trenches;
a plurality of third diffusion layers each provided in corresponding one of the active regions, each of the third diffusion layers being provided on the bottom surface of corresponding one of the gate trench, and electrically connected to corresponding one of the bit lines;
a plurality of first memory elements each electrically connected to corresponding one of the first diffusion layers; and a plurality of second memory elements each electrically connected to corresponding one of the second diffusion layers, wherein each of the first memory elements is electrically connected to corresponding one of the bit lines by activating corresponding one of the first word lines, and each of the second memory elements is electrically connected to corresponding one of the bit lines by activating corresponding one of the second word lines.

6. The semiconductor memory device as claimed in claim 5, wherein the first memory element connected to a predetermined active region and the second memory element connected to a different active region adjacent to the predetermined active region in the second direction are at a same position in the second direction.

7. The semiconductor memory device as claimed in claim 5, wherein a layout pitch of the gate trenches and a layout pitch of the bit lines are 2F (F is the minimum feature size).

8. The semiconductor memory device as claimed in claim 5, further comprising a plurality of bit-line cap dielectric films provided on the bit lines, respectively, each of the bit-line cap dielectric films having first and second side surfaces, wherein each of the first memory elements is provided to cover the first side surface of corresponding one of the bit-line cap dielectric films, and each of the second memory elements is provided to cover the second side surface of corresponding one of the bit-line cap dielectric films.

9. A semiconductor device comprising:

a gate trench including a bottom surface, and including first and second side surfaces facing each other;

first and the second diffusion layers that are each arranged at the both ends of the gate trench;

a third diffusion layer being placed at the bottom surface of the gate trench;

a first gate electrode covering the first side surface and providing a channel between the first diffusion layer and the third diffusion layer;

a second gate electrode covering the second side surface and providing a channel between the second diffusion layer and the third diffusion layer;

a bit line being disposed above both the first and second diffusion layers, and connecting electrically to the third diffusion layer;

a bit line cap dielectric film disposing over the bit line and having first and second side surfaces, wherein the first and second side surfaces are placed in the opposite side of the bit line cap dielectric film each other;

a first storage electrode covering at least the first side surface of the bit line cap dielectric film, and connecting electrically to the first diffusion layer;

a second storage electrode covering at least the second side surface of the bit line cap dielectric film, and connecting electrically to the second diffusion layer;

a capacitance dielectric film covering the first and second storage electrodes; and a plate electrode covering the capacitance dielectric film, wherein the plate electrode covering the first and second side surfaces of the bit line cap dielectric film extends downwardly beyond a bottom surface of the bit line.

10. The semiconductor device as claimed in claim 9, wherein each of upper surfaces of the first and second storage electrodes protrude upwardly from an upper surface of the bit line cap dielectric film.

11. The semiconductor device as claimed in claim 9, further comprising:

a bit line contact plug connecting electrically each of the third diffusion layer and the bit line; and a gate cap dielectric film covering the first and second gate electrodes, wherein the gate cap dielectric film isolates electrically the bit line contact plug from the first and second gate electrodes.

12. The semiconductor device as claimed in claim 9, further comprising an insular semiconductor body disposing on the first and second diffusion layers that connects electrically to each associate with one of the first and second storage electrodes.

13. The semiconductor device as claimed in claim 12, wherein both the first and second storage electrodes contact with the insular semiconductor body.

14. A semiconductor memory device comprising:

an active region formed with a gate trench having mutually opposite first and second side surfaces and a bottom surface, the active region having first and second diffusion layers positioned at both sides of the gate trench and a third diffusion layer formed on the bottom surface of the gate trench;

a first storage electrode connecting electrically to the first diffusion layer;

a second storage electrode connecting electrically to the second diffusion layer;

a capacitance dielectric film covering the first and second storage electrodes;

a plate electrode covering the capacitance dielectric film;

a bit line electrically connected to the third diffusion layer, the plate electrode extending downwardly beyond a bottom surface of the bit line;

a first gate electrode that covers the first side surface of the gate trench via a first gate dielectric film, the first gate electrode producing a channel between the first diffusion layer and the third diffusion layer;

a second gate electrode that covers the second side surface of the gate trench via a second gate dielectric film, the second gate electrode producing a channel between the second diffusion layer and the third diffusion layer; and a bit line cap dielectric film disposed over the bit line and having first and second side surfaces, the plate electrode covering the first and second side surfaces of the bit line cap dielectric film.

15. The semiconductor memory device as claimed in claim 14, further comprising:

a bit-line contact plug common to the first and second gate electrodes and connected to the bottom surface of the gate trench, wherein the bottom surface of the bit line is formed on an upper surface of the bit-line contact plug.

16. The semiconductor memory device as claimed in claim 15, further comprising:

a semiconductor substrate, the gate trench being formed in the substrate; and a gate-cap dielectric film that electrically insulates the bit-line contact plug from the first and second gate electrodes, the gate-cap dielectric film comprising a upper portion which is formed along a surface of the substrate outside of the gate trench, wherein the capacitance dielectric film comprises a lower portion which is formed along the upper portion of the gate-cap dielectric film, and the plate electrode extends downwardly from above the bit line cap dielectric film to the lower portion of the capacitance dielectric film.

* * * * *